US010861866B2

(12) United States Patent
Choi

(10) Patent No.: US 10,861,866 B2
(45) Date of Patent: Dec. 8, 2020

(54) SEMICONDUCTOR DEVICE AND MANUFACTURING METHOD THEREOF

(71) Applicant: SK hynix Inc., Icheon-si (KR)

(72) Inventor: Kang Sik Choi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/011,884

(22) Filed: Jun. 19, 2018

(65) Prior Publication Data

US 2019/0115362 A1 Apr. 18, 2019

(30) Foreign Application Priority Data

Oct. 12, 2017 (KR) .................... 10-2017-0132696

(51) Int. Cl.
| | |
|---|---|
| *H01L 27/11582* | (2017.01) |
| *H01L 27/1157* | (2017.01) |
| *H01L 49/02* | (2006.01) |
| *H01L 27/11575* | (2017.01) |
| *H01L 27/06* | (2006.01) |
| H01L 27/11573 | (2017.01) |

(52) U.S. Cl.
CPC .... *H01L 27/11582* (2013.01); *H01L 27/0629* (2013.01); *H01L 27/1157* (2013.01); *H01L 27/11575* (2013.01); *H01L 28/20* (2013.01); *H01L 27/11573* (2013.01)

(58) Field of Classification Search
CPC . H01L 27/0629; H01L 28/20; H01L 27/1157; H01L 27/11553–11556; H01L 27/1158–11582; H01L 27/11273
See application file for complete search history.

(56) References Cited

U.S. PATENT DOCUMENTS

| | | | |
|---|---|---|---|
| 9,437,606 B2 | 9/2016 | Makala et al. | |
| 2012/0168858 A1 | 7/2012 | Hong | |
| 2014/0042520 A1* | 2/2014 | Lee | H01L 27/11582 |
| | | | 257/324 |
| 2017/0162594 A1* | 6/2017 | Ahn | H01L 21/31 |
| 2017/0207226 A1* | 7/2017 | Lee | H01L 27/11582 |
| 2017/0338241 A1* | 11/2017 | Lee | H01L 27/0688 |
| 2017/0358356 A1* | 12/2017 | Lee | H01L 29/517 |
| 2018/0151590 A1* | 5/2018 | Lee | H01L 27/11582 |
| 2019/0043830 A1* | 2/2019 | Sakakibara | H05K 7/023 |
| 2019/0115363 A1* | 4/2019 | Choi | H01L 27/11582 |

FOREIGN PATENT DOCUMENTS

| | | |
|---|---|---|
| KR | 1020120094338 A | 8/2012 |
| KR | 1020190041283 A | 4/2019 |

\* cited by examiner

*Primary Examiner* — Thanh Y. Tran
(74) *Attorney, Agent, or Firm* — William Park & Associates Ltd.

(57) ABSTRACT

A semiconductor device and a method of manufacturing a semiconductor device pertain to a semiconductor device having a channel pillar extending in a first direction and a first conductive pattern surrounding the channel pillar. The semiconductor device also has second conductive patterns surrounding the channel pillar above the first conductive pattern, wherein the second conductive patterns are stacked in the first direction and spaced apart from each other. The semiconductor device further has an etch stop pattern disposed above the first conductive pattern and below the second conductive patterns.

19 Claims, 27 Drawing Sheets

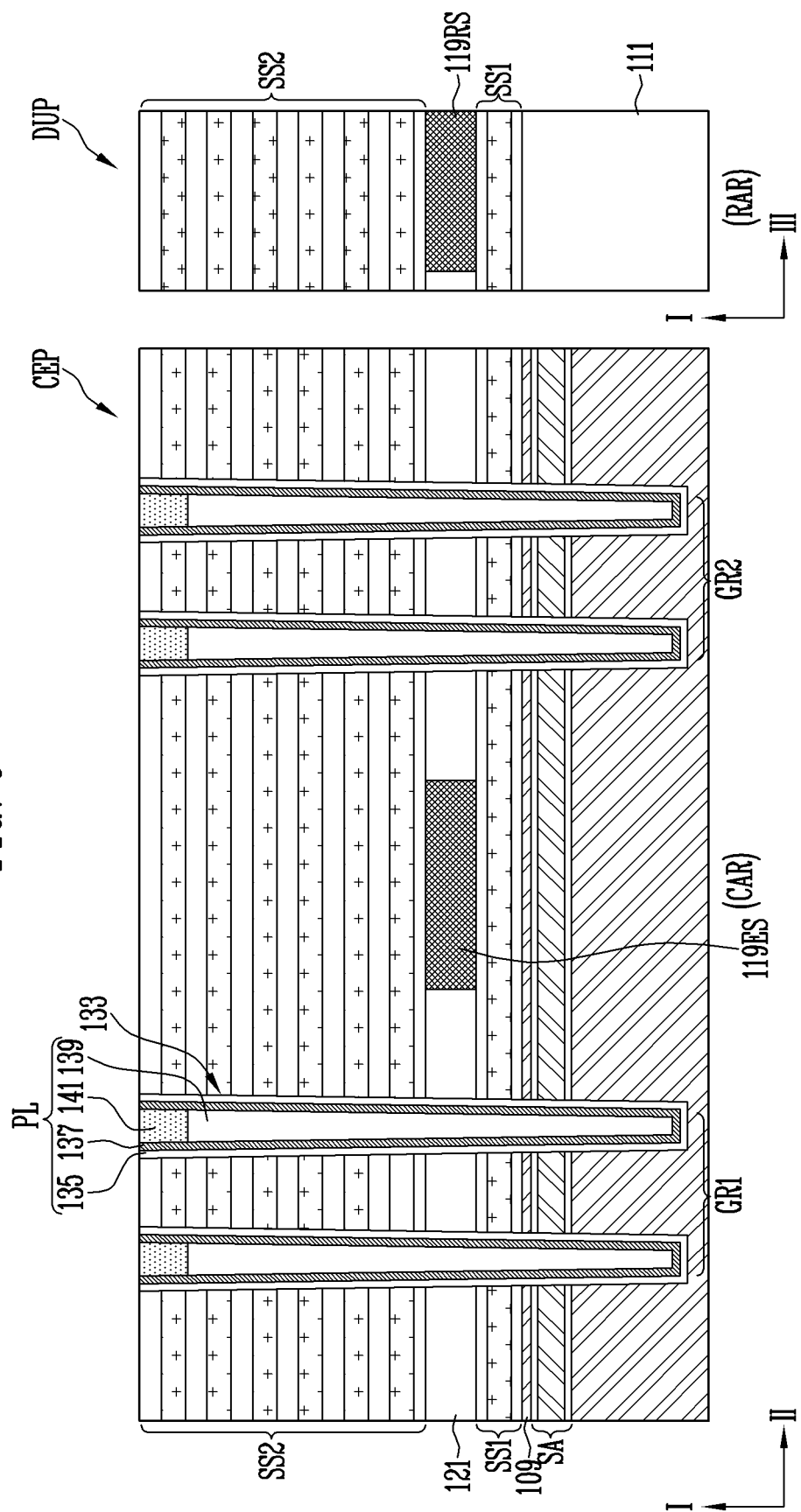

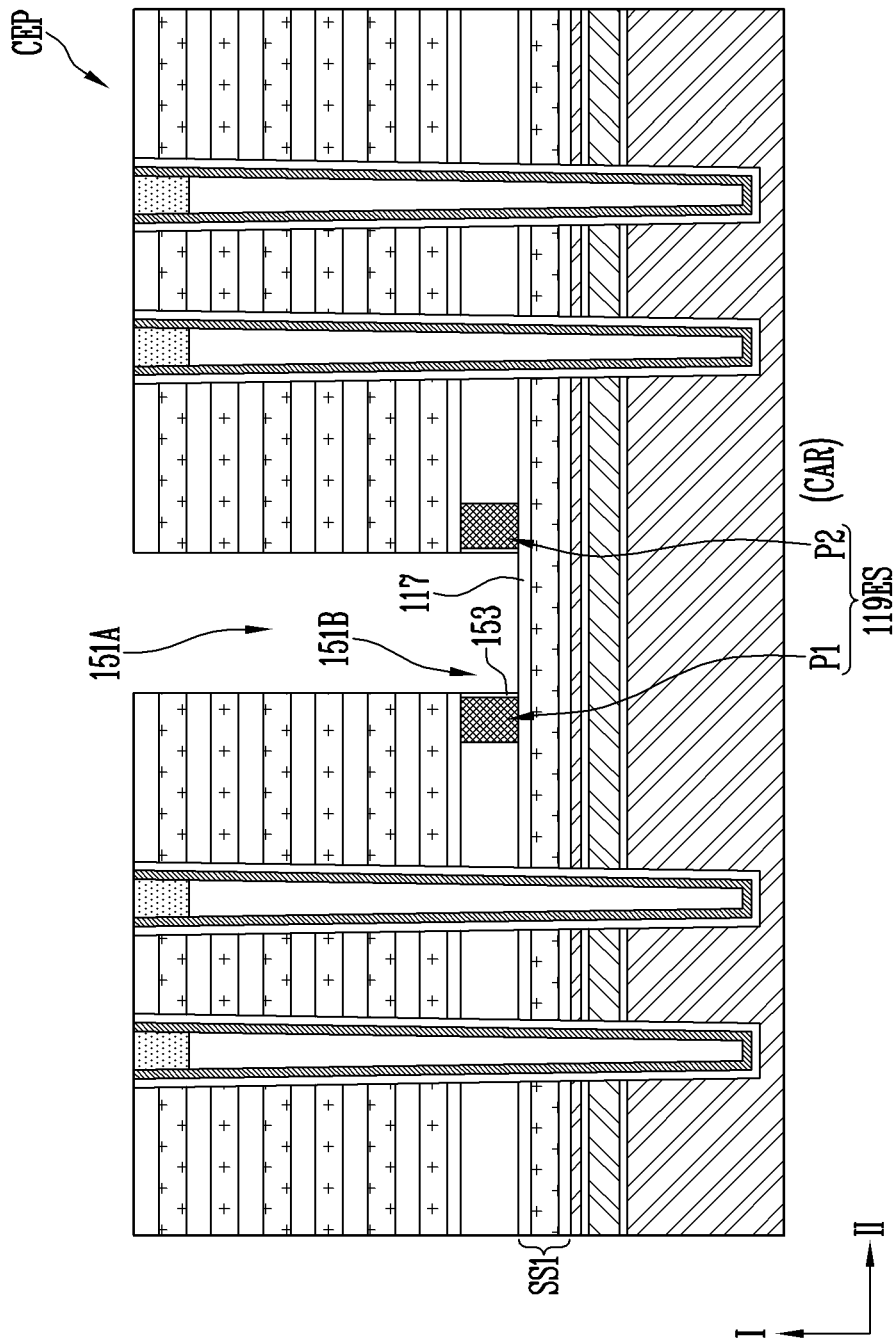

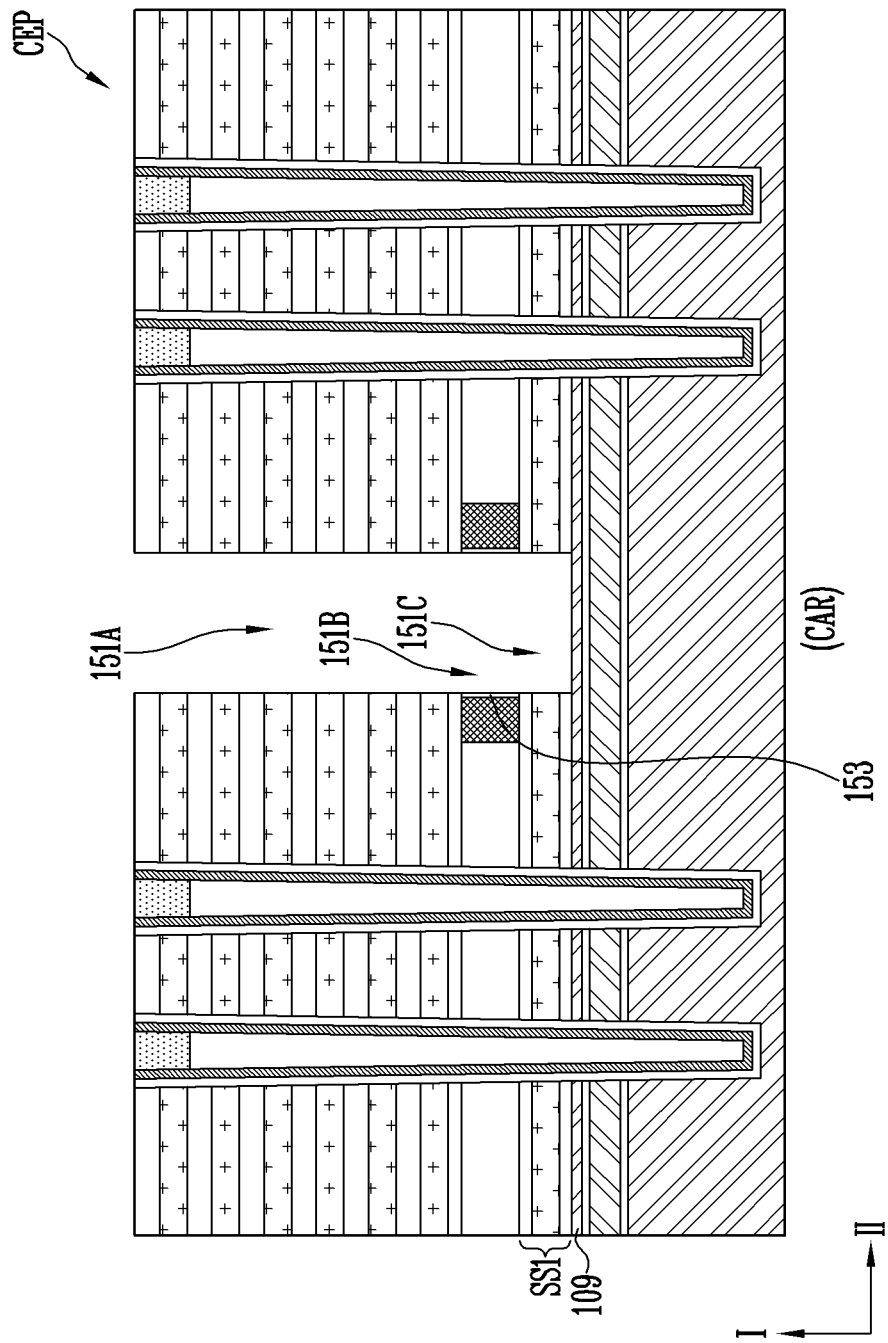

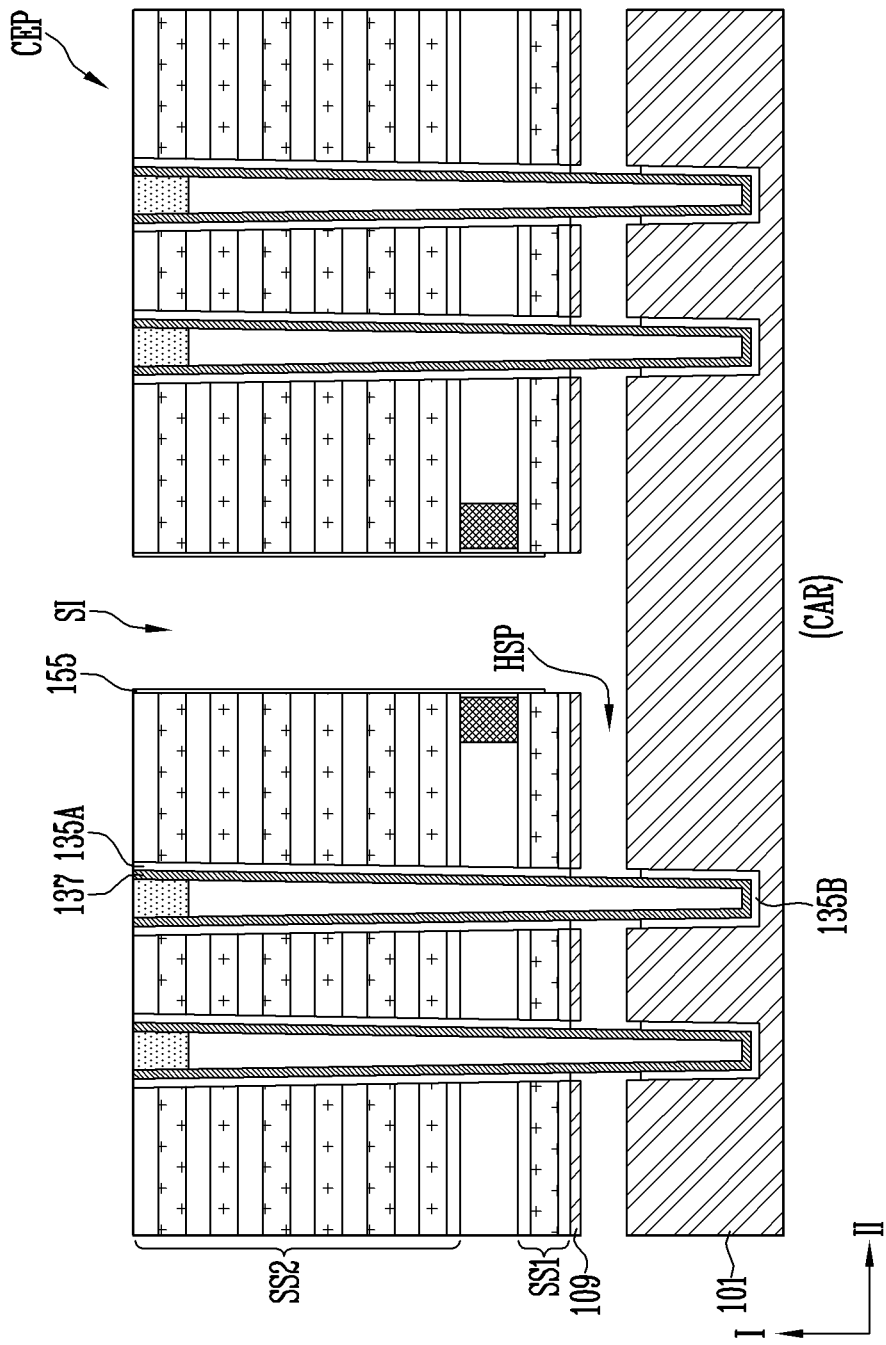

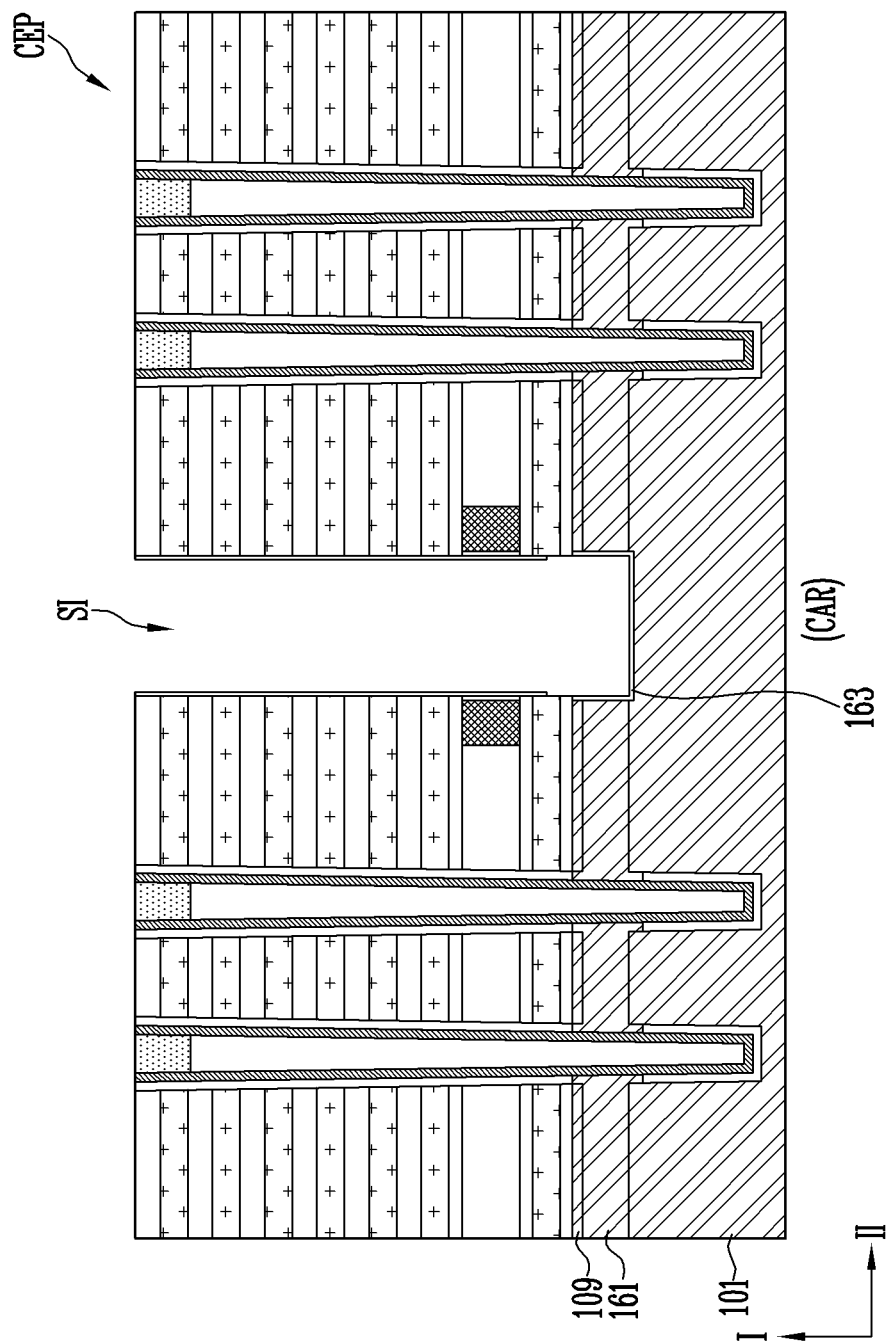

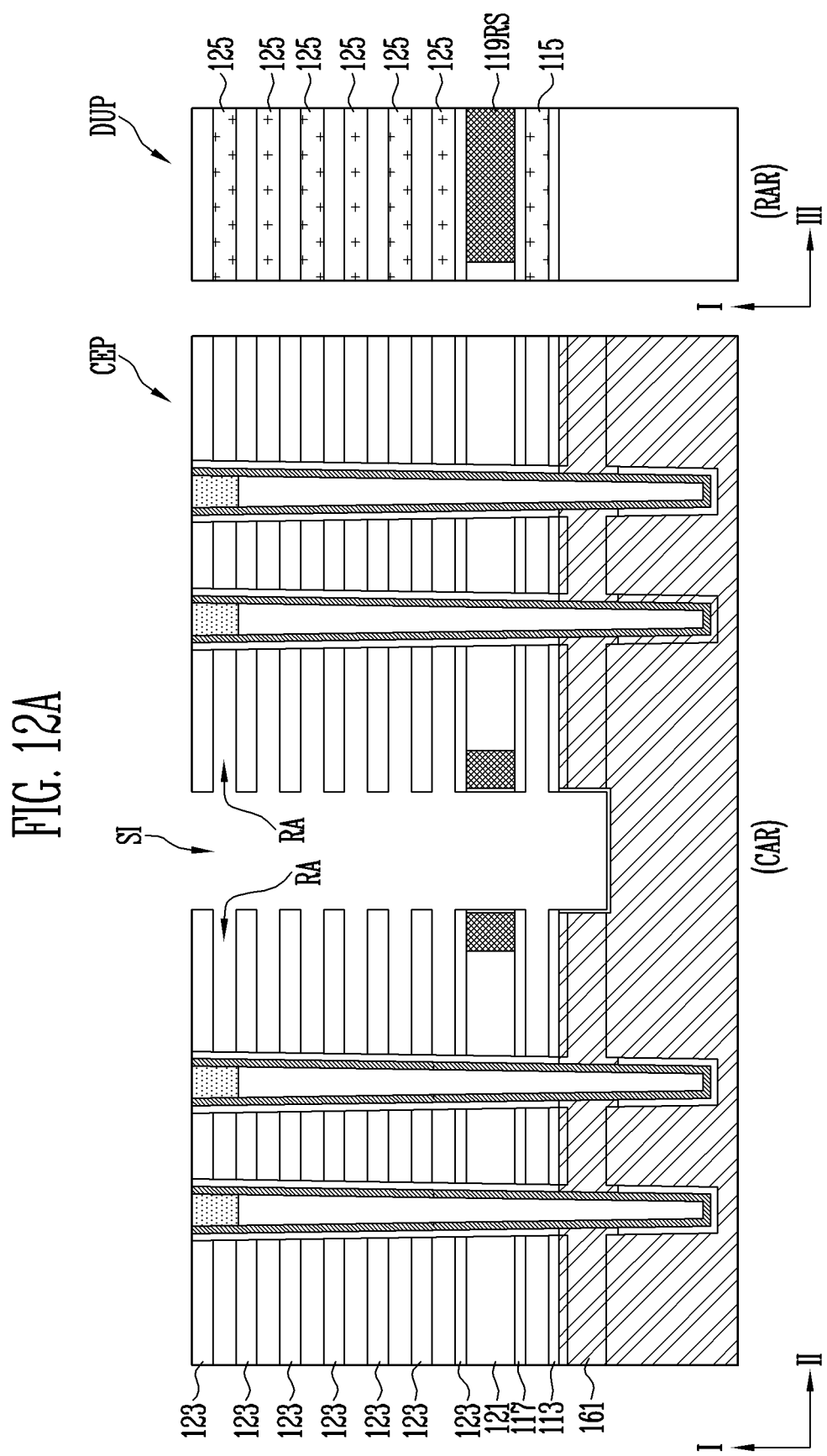

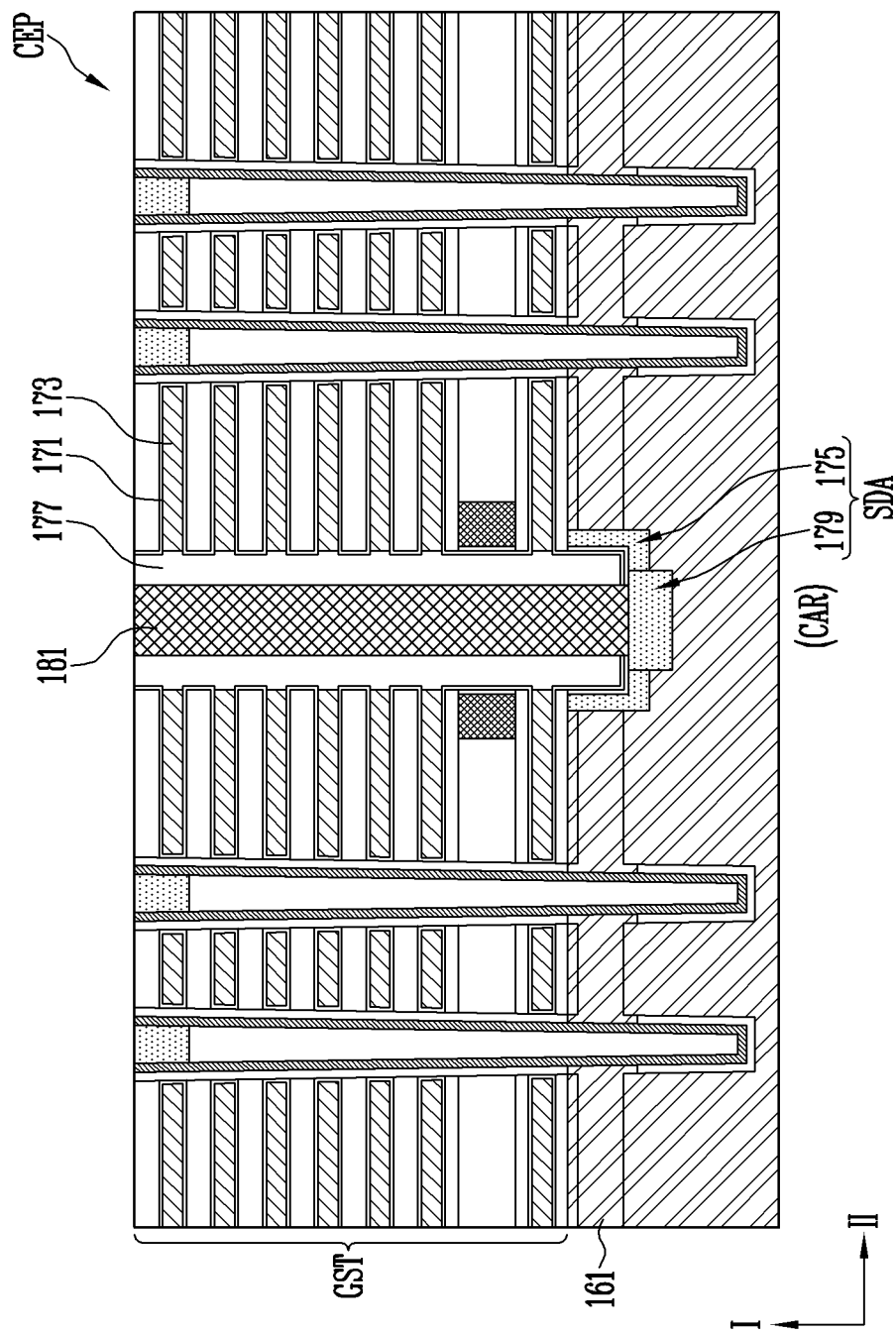

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2017-0132696 filed on Oct. 12, 2017, in the Korean Intellectual Property Office, the entire disclosure of which is incorporated herein by reference.

BACKGROUND

1. Technical Field

An aspect of the present disclosure may generally relate to a semiconductor device and a manufacturing method thereof, and more particularly, to a three-dimensional semiconductor device and a manufacturing method thereof.

2. Related Art

Semiconductor devices may include a plurality of memory cell transistors, which are capable of storing data. The memory cell transistors can be connected in series between select transistors to constitute a memory string. Three-dimensional semiconductor devices achieve a high degree of integration. However, manufacturing three-dimensional semiconductor devices can involve additional complications over manufacturing two-dimensional semiconductor devices.

SUMMARY

In accordance with the present teachings is a semiconductor device having a channel pillar extending in a first direction and a first conductive pattern surrounding the channel pillar. The semiconductor device also has second conductive patterns surrounding the channel pillar above the first conductive pattern, wherein the second conductive patterns are stacked in the first direction and spaced apart from each other. The semiconductor device further has an etch stop pattern disposed above the first conductive pattern and below the second conductive patterns.

Also in accordance with the present teachings is a semiconductor device having a first channel pillar and a second channel pillar extending in a first direction from inside a well doped semiconductor layer. The semiconductor device also has a first gate stack structure disposed above the well doped semiconductor layer, and a second gate stack structure disposed above the well doped semiconductor layer. The first gate stack structure surrounds the first channel pillar and the second gate stack structure surrounds the second channel pillar. The semiconductor device additionally has a first channel contact layer disposed between the well doped semiconductor layer and the first gate stack structure, wherein the first channel contact layer surrounds the first channel pillar. The semiconductor device also has a second channel contact layer disposed between the well doped semiconductor layer and the second gate stack structure, wherein the second channel contact layer surrounds the second channel pillar. The semiconductor device further has a slit disposed between the first gate stack structure and the second gate stack structure. The semiconductor device additionally has a sidewall insulating layer formed on a sidewall of the slit. Each of the first and second gate stack structures includes interlayer insulating layers and gate electrodes, which are alternately stacked along the first direction. Further an etch stop pattern is disposed between two gate electrodes of the gate electrodes adjacent to the well doped semiconductor layer.

Further in accordance with the present teachings is a method of manufacturing a semiconductor device. The method includes forming a first stack structure including a first sacrificial layer and a first interlayer insulating layer, forming a poly-silicon layer on the first stack structure, and forming a second stack structure in which second interlayer insulating layers and second sacrificial layers are alternately stacked on the poly-silicon layer. The method also includes forming a slit penetrating the second stack structure, the poly-silicon layer, and the first stack structure. The method further includes replacing, through the slit, the first sacrificial layer and the second sacrificial layers with conductive patterns.

Additionally in accordance with the present teachings is a method of manufacturing a semiconductor device. The method includes forming a first stack structure comprising a first sacrificial layer and a first interlayer insulating layer. The method also includes forming an etch stop pattern over the first stack structure. The method further includes forming a second stack structure over the etch stop layer, wherein the second stack structure comprises alternately stacked second sacrificial layers and second interlayer insulating layers.

BRIEF DESCRIPTION OF THE DRAWINGS

FIGS. 6A, 6B, 7, 8, 9, 10A to 10D, 11A to 11D, 12A, 12B, and 13A to 13C show sectional views illustrating a manufacturing method of a semiconductor device according to an embodiment of the present disclosure.

DETAILED DESCRIPTION

Figure 1:
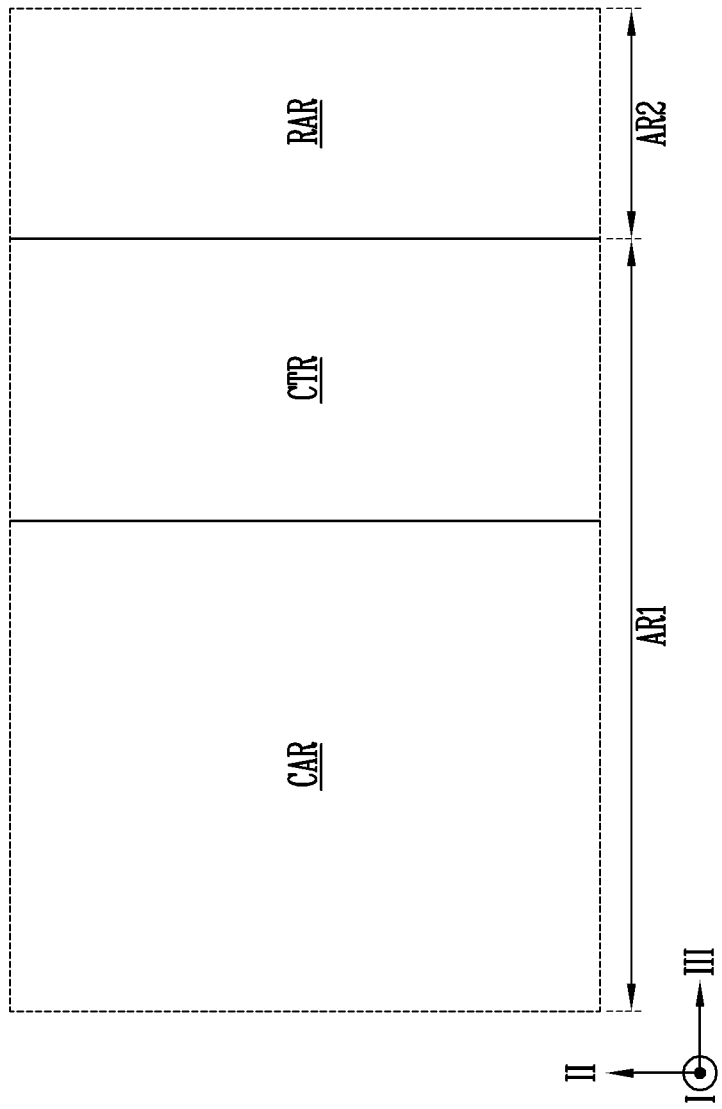
FIG. 1 shows a plan view illustrating various regions of a semiconductor device according to an embodiment of the present disclosure.

Example embodiments of the present disclosure are described with reference to the accompanying drawings. The example embodiments, however, may be embodied in many different forms and should not be construed as being limited to the examples of embodiments set forth herein. Rather, the example embodiments are provided so that the present teachings are clear and enabling for those skilled in the art. The features of the present teachings may be employed in various and numerous embodiments, not all of which are presented, without departing from the scope of the present disclosure.

In the drawings, relative dimensions may be exaggerated for clarity. The drawings are not to scale. Like reference numerals refer to like elements throughout. In the drawing figures, dimensions may be exaggerated for clarity of illustration.

It will be understood that when an element is referred to as being "between" two elements, it can be the only element between the two elements, or one or more intervening elements may also be present. It is also noted that in this specification, "connected/coupled" refers to one component not only directly coupling another component but also indirectly coupling another component through an intermediate component. On the other hand, "directly connected/directly coupled" refers to one component directly coupling another component without an intermediate component. It is also noted that, "on" refers to one component not only directly on another component but also indirectly on another component through an intermediate component or intermediate components. On the other hand, 'directly on' refers to one component directly on another component without an intermediate component.

Embodiments provide a semiconductor device and a manufacturing method thereof, which may lower the level of difficulty of manufacturing processes of a three-dimensional semiconductor device.

In an embodiment in accordance with the present teachings, for example, a method of manufacturing a semiconductor device includes forming a first stack structure comprising a first sacrificial layer and a first interlayer insulating layer. The method also includes forming an etch stop layer over the first stack structure and forming an etch stop pattern by etching the etch stop layer. The method further includes forming a second stack structure over the etch stop layer, wherein the second stack structure comprises alternately stacked second sacrificial layers and second interlayer insulating layers.

In a further embodiment, the method of manufacturing the semiconductor device further includes forming a slit by etching a first through part through the second stack structure to the etch stop pattern, wherein the first through part exposes the second sacrificial layers and the second interlayer insulating layers. For another embodiment, the method further includes deepening the slit by etching a second through part from the bottom of the first through part, through the etch stop pattern, to the first insulating layer. In a further embodiment, the method also includes deepening the slit by etching a third through part from the bottom of the second through part, through the first insulating layer, through the first sacrificial layer, to a horizontal channel layer disposed below the first stack structure. For an additional embodiment, the method includes deepening the slit by etching a fourth through part from the bottom of the third through part, through the horizontal channel layer, to a lower sacrificial layer of a sacrificial structure disposed below the horizontal channel layer.

In a further embodiment, the method of manufacturing the semiconductor device also includes removing at least a portion of the sacrificial structure through the slit to expose a multi-layered memory layer disposed on a sidewall of a channel pillar, wherein the channel pillar extends from a well doped semiconductor layer to pass through the first stack structure, through a layer in which the etch stop pattern is disposed, and through the second stack structure. The method further includes removing a portion of the multi-layered memory layer to expose a portion of a sidewall of the channel pillar and replacing the removed portion of the sacrificial structure with a channel contact layer so that the channel contact layer directly contacts the exposed portion of the sidewall of the channel pillar.

FIG. 1 shows a plan view illustrating various regions of a semiconductor device according to an embodiment of the present disclosure.

Referring to FIG. 1, the semiconductor device may include a first region AR1 and a second region AR2, which are adjacent to each other. The first region AR1 may include a cell array region CAR and at least one contact region CTR. The contact region CTR may extend from the cell array region CAR, as shown. The second region AR2 may include at least one resistive element region RAR.

The first region AR1 is a region in which gate electrodes of memory cell transistors and select transistors are disposed. Each of the gate electrodes may extend toward the contact region CTR from the cell array region CAR. A structure of conductive patterns corresponding to the gate electrodes is described in detail below with reference to FIGS. 2A and 2B.

The cell array region CAR is a region in which channel pillars are disposed. Each of the channel pillars may extend in a first direction I, and the channel pillars may be arranged in various layouts along second II and third III directions, shown to be perpendicular to the first direction I. The channel pillars are described in detail below with respect to FIGS. 2A and 2B.

The contact region CTR is a region in which end portions of the gate electrodes surrounding the channel pillars in the cell array region CAR are disposed. The end portions of the gate electrodes may form a step structure. The step structure formed by the gate electrodes is described in detail below with reference to FIGS. 4A and 4B.

The second region AR2 is a region in which the gate electrodes are not disposed. Elements constituting peripheral circuits may be disposed in the second region AR2. For example, the second region AR2 may include a resistive element region RAR in which a resistive element is disposed. The semiconductor device uses a resistor to generate a bias of a desired level. The resistor is used in a circuit for applying an operating voltage or a circuit for controlling the operating voltage. Representatively, the resistor is used in a pump regulator circuit for voltage division. A resistor pattern is described in detail below with reference to FIGS. 4A and 4B.

Figure 2A:
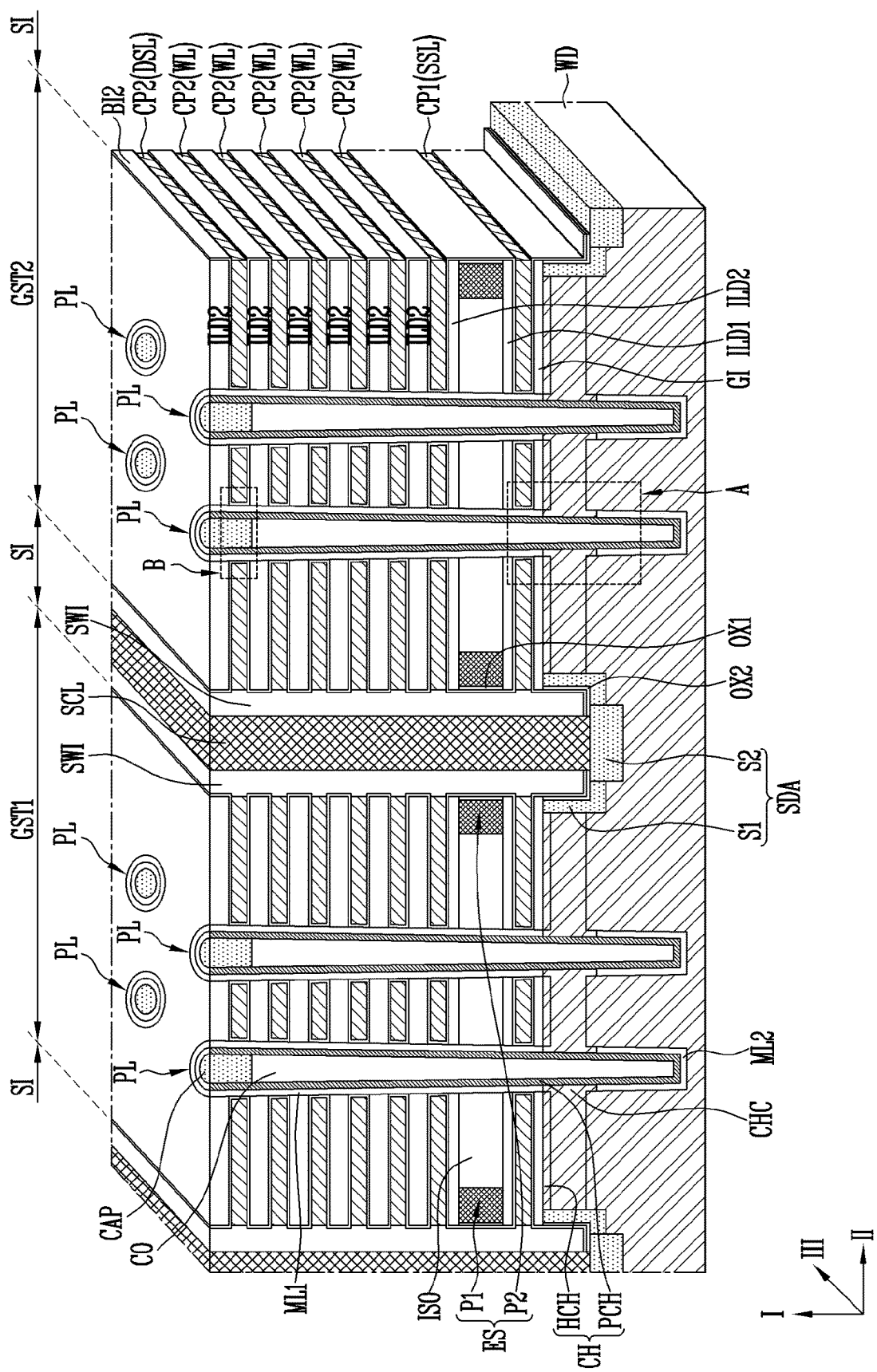
FIGS. 2A and 2B show perspective views illustrating semiconductor devices according to embodiments of the present disclosure.
Figure 2B:
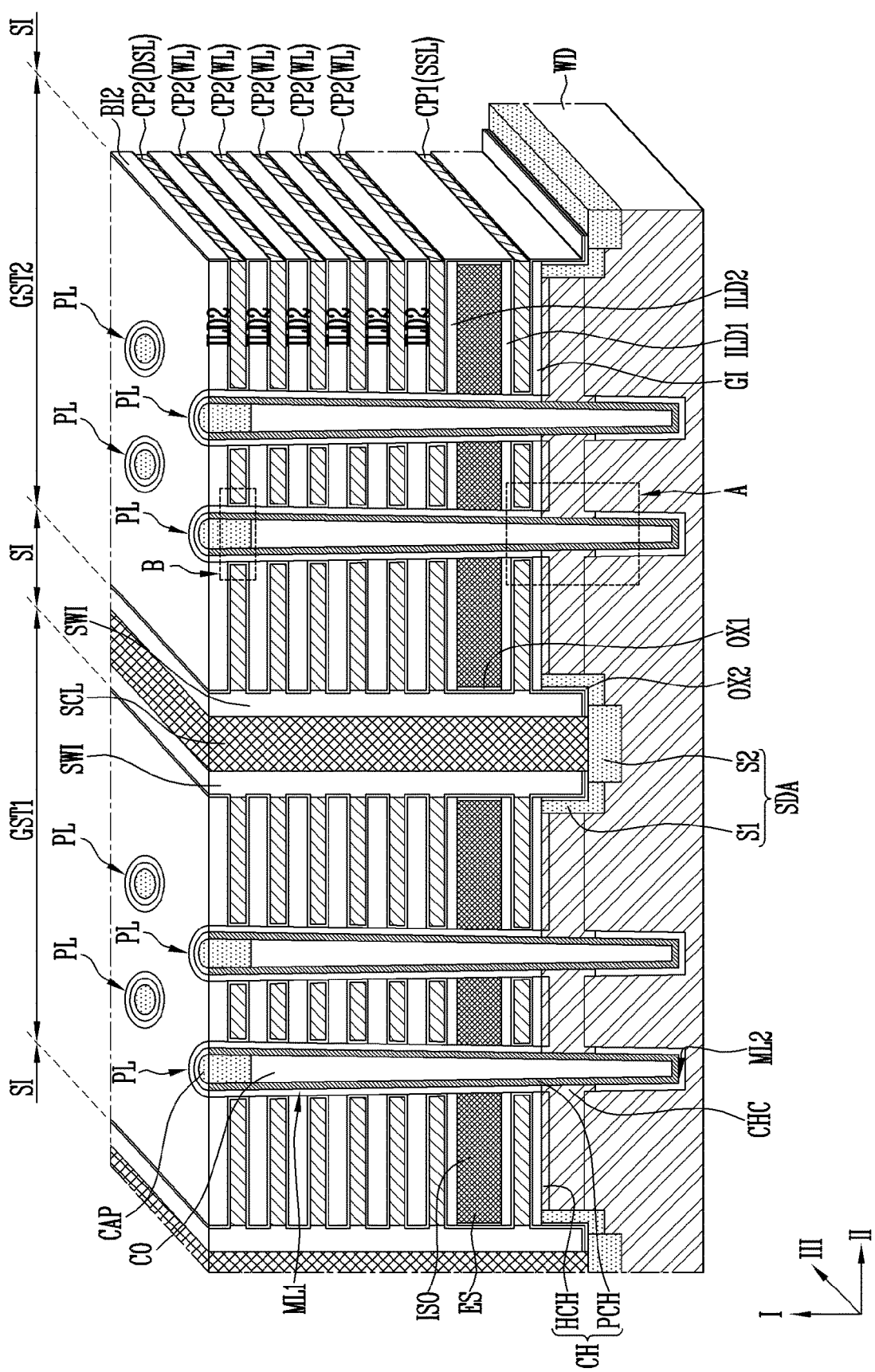

FIGS. 2A and 2B show perspective views illustrating semiconductor devices according to embodiments of the present disclosure. In particular, FIGS. 2A and 2B show perspective views illustrating structures formed in the cell array region CAR shown in FIG. 1.

Referring to FIGS. 2A and 2B, the semiconductor device may include a well doped semiconductor layer WD, cell plugs PL extending in a first direction I from inside the well doped semiconductor layer WD, gate stack structures GST1 and GST2 surrounding the cell plugs PL, a source dopant region SDA disposed between the gate stack structures GST1 and GST2, and a source contact line SCL in contact with the source dopant region SDA.

The gate stack structures GST1 and GST2 are disposed between the well doped semiconductor layer WD and bit lines (not shown). In FIGS. 2A and 2B, illustration of the bit lines is omitted for convenience of description, but the bit lines may be disposed above the gate stack structures GST1 and GST2 to be each connected to at least one of the cell plugs PL corresponding thereto. A connection structure disposed between the bit lines and the cell plugs PL may vary in design for different embodiments. Two gate stack structures GST1 and GST2 are illustrated in FIGS. 2A and 2B, but the semiconductor device may include a greater number of gate stack structures isolated by slits SI. In FIGS. 2A and 2B, illustration of a sidewall insulating layer SWI and a source contact line SCL, which are disposed in one slit among the slits SI, is omitted to show the source dopant region SDA and a second blocking insulating layer BI2 extending in the third direction III.

The well doped semiconductor layer WD may be disposed under the gate stack structures GST1 and GST2 and may be spaced apart from the gate stack structures GST1 and GST2. The cell plugs PL may extend to the inside of the well doped semiconductor layer WD. That is, a lower portion of each of the cell plugs PL may be surrounded by the well doped semiconductor layer WD.

The well doped semiconductor layer WD may be formed of at least one doped silicon layer including a first conductivity type dopant. The first conductivity type dopant may be a p-type dopant such that the well doped semiconductor layer WD may be used as a well body. The concentration of the first conductivity type dopant in the well doped semiconductor layer WD decreases with decreasing distance to the gate stack structures GST1 and GST2. More specifically, the first conductivity type dopant may be dispersed in the well doped semiconductor layer WD at a concentration that gradually decreases in a direction toward an upper portion of the well doped semiconductor layer WD and gradually increases in a direction toward a lower portion of the well doped semiconductor layer WD.

The cell plugs PL penetrate the gate stack structures GST1 and GST2. Each of the cell plugs PL may include a channel pillar PCH, a first multi-layered memory pattern ML1, a second multi-layered memory pattern ML2, and a capping pattern CAP.

The channel pillar PCH may penetrate the gate stack structures GST1 and GST2 and extend to the inside of the well doped semiconductor layer WD. The channel pillar PCH may be formed of a semiconductor layer. For example, the channel pillar PCH may be formed of a silicon layer. The channel pillar PCH may be a thin film surrounding a core insulating layer CO. The core insulating layer CO may be formed to have a height lower than that of the channel pillar PCH. In this case, the semiconductor device may further include the capping pattern CAP. The capping pattern CAP may be disposed on the core insulating layer CO and may be formed to fill in an upper central portion of the channel pillar PCH. The capping pattern CAP may be in direct contact with the channel pillar PCH. The capping pattern CAP may be formed of a doped semiconductor layer including a second conductivity type dopant. The first conductivity type and the second conductivity type are opposite to each other. The second conductivity type dopant may be an n-type dopant. More specifically, the capping pattern CAP may be an n-type doped silicon layer. The capping pattern CAP may be used as a drain junction.

Although not shown in the drawings, the capping pattern CAP and the core insulating layer CO may be omitted in some embodiments. In this case, the channel pillars PCH may be formed to completely fill in central regions of holes penetrating the gate stack structures GST1 and GST2.

The first multi-layered memory pattern ML1 surrounds an upper outer wall of the channel pillar PCH, and the second multi-layered memory pattern ML2 surrounds a lower outer wall of the channel pillar PCH. More specifically, the first multi-layered memory pattern ML1 extends along an interface between each of the gate stack structures GST1 and GST2 and the channel pillar PCH. The second multi-layered memory pattern ML2 extends along an interface between the well doped semiconductor layer WD and the channel pillar PCH. The first and second multi-layered memory patterns ML1 and ML2 may be formed of the same material layer. The material layer constituting each of the first and second multi-layered memory patterns ML1 and ML2 is described below with reference to FIGS. 3A and 3B.

The well doped semiconductor layer WD and the channel pillar PCH may be connected to each other by a channel contact layer CHC. The channel contact layer CHC is disposed in a space between the well doped semiconductor layer WD and the gate stack structures GST1 and GST2. The channel contact layer CHC is in direct contact with a top surface of the well doped semiconductor layer WD. The channel contact layer CHC is in direct contact with a sidewall of the channel pillar PCH between the first multi-layered memory pattern ML1 and the second multi-layered memory pattern ML2, and the channel contact layer CHC is formed to surround the channel pillar PCH.

A horizontal channel layer HCH may be further formed between the channel contact layer CHC and the gate stack structures GST1 and GST2. The horizontal channel layer HCH surrounds the channel pillar PCH. The channel pillar PCH and the horizontal channel layer HCH may be used as a channel pattern CH. The channel pattern CH may provide a current flow path when the semiconductor device operates.

The channel contact layer CHC and the horizontal channel layer HCH may be formed of a doped semiconductor layer or an undoped semiconductor layer. For example, the channel contact layer CHC and the horizontal channel layer HCH may be formed of a doped silicon layer or an undoped silicon layer. The channel contact layer CHC and the horizontal channel layer HCH may include the first conductivity type dopant diffused from the well doped semiconductor layer WD.

Each of the gate stack structures GST1 and GST2 surrounds the channel pillar PCH. Each of the gate stack structures GST1 and GST2 may include a gate insulating layer GI, interlayer insulating layers ILD1 and ILD2, conductive patterns CP1 and CP2, and at least one etch stop pattern ES. The interlayer insulating layers ILD1 and ILD2 and the conductive patterns CP1 and CP2 may be alternately stacked along the first direction I.

The conductive patterns CP1 and CP2 may be divided into a first conductive pattern CP1 disposed under the etch stop pattern ES and second conductive patterns CP2 stacked above the etch stop pattern ES and spaced apart from one another in the first direction I. The etch stop pattern ES is disposed between the first conductive pattern CP1 and the second conductive patterns CP2, which are adjacent to each other in the first direction I.

The conductive patterns CP1 and CP2 are used as gate electrodes. The gate electrodes include a source select line SSL, word lines WL, and a drain select line DSL. The first conductive pattern CP1 is a pattern disposed closest to the well doped semiconductor layer WD among the conductive patterns CP1 and CP2, and the first conductive pattern CP1 may be used as the source select line SSL. The second conductive patterns CP2 may be used as the word lines WL and the drain select line DSL. The drain select line DSL is disposed above the word lines WL. The word lines WL may be disposed between the drain select line DSL and the etch stop pattern ES. The etch stop pattern ES may be disposed between the source select line SSL and the word lines WL.

The interlayer insulating layers ILD1 and ILD2 may be formed of an insulating material such as an oxide layer. The interlayer insulating layers ILD1 and ILD2 may be divided into first and second interlayer insulating layers. The first interlayer insulating layer ILD1 is disposed between the first conductive pattern CP1 and the etch stop pattern ES, which are adjacent to each other in the first direction I. The second interlayer insulating layers ILD2 are disposed on the etch stop pattern ES. The second interlayer insulating layers ILD2 are spaced apart from each other in the first direction I and disposed on the top and bottom of each of the second conductive patterns CP2 stacked to be spaced apart from each other. According to the above-described structure, the second conductive patterns CP2 and the second interlayer insulating layers ILD2 may be alternately stacked one-by-one in the first direction I.

The gate insulating layer GI may be disposed between the first conductive pattern CP1 and the well doped semiconductor layer WD. The gate insulating layer GI may be formed of a silicon oxide layer.

The first conductive pattern CP1 and the second conductive patterns CP2 are formed of the same conductive material. The etch stop pattern ES may be formed of a conductive material different from that of the first conductive pattern CP1 and the second conductive patterns CP2. The etch stop pattern ES may be formed of a material layer capable of serving as an etch stop layer by considering a process of forming the slit SI. The etch stop pattern ES may be formed of a material having an etching rate different from an etching rate of the interlayer insulating layers ILD1 and ILD2. For convenience or manufacturing simplification, the etch stop pattern ES may be formed of the same material as a resistor pattern disposed in a resistive element region. The resistor pattern is described in detail below with reference to FIGS. 4A and 4B.

The etch stop pattern ES may be formed of a poly-silicon layer. The poly-silicon layer may include a dopant. For example, the poly-silicon layer may include an n-type dopant.

The etch stop pattern ES is formed sufficiently thick to serve as an etch stop layer in an etching process for forming the slit SI. More specifically, the etch stop pattern ES may be formed thicker than each of the first conductive pattern CP1 and the second conductive patterns CP2.

The first and second conductive patterns CP1 and CP2 are formed of a conductive material having a low resistance. More specifically, the first and second conductive patterns CP1 and CP2 may include a metal layer having a low resistance. For example, the first and second conductive patterns CP1 and CP2 may be formed of tungsten.

The gate stack structures GST1 and GST2 are isolated from each other by the slits SI. For example, each slit SI may be disposed between a first gate stack structure GST1 and a second gate stack structure GST2, which are adjacent to each other in the second direction II, to allow the first and second gate stack structures GST1 and GST2 to be isolated from each other.

A plurality of channel pillars PCH surrounded by the first gate stack structure GST1 may be defined as first channel pillars, and a plurality of channel pillars PCH surrounded by the second stack structure GST2 may be defined as second channel pillars. The channel contact layer CHC surrounding the first channel pillars and the channel contact layer CHC surrounding the second channel pillars may be isolated from each other by the slit SI.

The gate stack structures GST1 and GST2 and the slit SI may extend in a third direction III. The slit SI may extend down to the top surface of the well doped semiconductor layer WD.

Due to the particulars of a manufacturing process, a first oxidation region OX1 may remain on a sidewall of the etch stop pattern ES adjacent to the slit SI. Further, a second oxidation region OX2 may remain along sidewalls of the channel contact layer CHC and the horizontal channel layer HCH, which are adjacent to the slit SI. The second oxidation region OX2 may extend along a bottom surface of the slit SI.

A sidewall insulating layer SWI may be disposed on a sidewall of the slit SI. The sidewall insulating layer SWI may be disposed on a sidewall of each of the gate stack structures GST1 and GST2. The sidewall insulating layer SWI may extend in the first direction I and the third direction III, as shown. The sidewall insulating layer SWI may extend along the sidewall of the horizontal channel layer HCH and the sidewall of the channel contact layer CHC.

The source contact line SCL is disposed on the sidewall insulating layer SWI in the slit SI. According to the above-described structure, the sidewall insulating layer SWI is disposed between the source contact line SCL and a stack structure including the channel contact layer CHC, the horizontal channel layer HCH, and the gate stack structure GST1 or GST2, to insulate the source contact line SCL from the gate stack structure GST1 or GST2. The source contact line SCL may be in contact with the source dopant region SDA formed in the well doped semiconductor layer WD and may extend in the first I and third III directions. The source contact line SCL may be formed of various materials, such as a silicide layer, a metal layer, and/or a doped silicon layer.

The source dopant region SDA may include a second conductivity type dopant opposite to the first conductivity type dopant. The second conductivity dopant is an n-type dopant. The source dopant region SDA may extend up to the inside of the channel contact layer CHC and the horizontal channel layer HCH. More specifically, the source dopant region SDA may include a first source region S1 and a second source region S2. The first source region S1 may be defined in each of the channel contact layer CHC, the horizontal channel layer HCH, and the well doped semiconductor layer WD, which are adjacent to the sidewall insulating layer SWI. The second source region S2 may be defined in the well doped semiconductor layer WD adjacent to the source contact line SCL. The source contact line SCL may be in direct contact with the second source region S2. The second source region S2 may include a second conductivity type dopant having a concentration higher than that of the second conductivity type dopant in the first source region S1 so as to obtain ohmic contact between the source contact line SCL and the source dopant region SDA.

Due to particulars of the manufacturing process, the second blocking insulating layer BI2 may extend along interfaces between the interlayer insulating layers ILD1 and ILD2 and gate insulating layer GI and the first and second conductive patterns CP1 and CP2, interfaces between the interlayer insulating layers ILD1 and ILD2 and the sidewall insulating layer SWI, interfaces between the first multi-layered memory pattern ML1 and the first and second conductive patterns CP1 and CP2, and an interface between the etch stop pattern ES and the sidewall insulating layer SWI. The second blocking insulating layer BI2 may not be formed on sidewalls of the first and second conductive patterns CP1 and CP2 facing the source contact line SCL and the sidewall insulating layer SWI.

The etch stop pattern ES may be disposed in various forms in a cell array region.

For example, referring to FIG. 2A, each of the first conductive pattern CP1 and the second conductive patterns CP2 may have a slit-side end portion adjacent to the slit SI. The etch stop pattern ES overlaps with the slit-side end portion of each of the first conductive pattern CP1 and the second conductive patterns CP2, and the etch stop pattern ES may be disposed not to surround the cell plugs PL. In this case, the etch stop pattern ES of each of the gate stack structures GST1 and GST2 may be divided into a first pattern P1 and a second pattern P2 by an isolation insulating layer ISO surrounding the cell plugs PL.

The isolation insulating layer ISO is disposed in the same layer as the etch stop pattern ES between the first conductive pattern CP1 and the second conductive patterns CP2 and surrounds the channel pillars PCH. The isolation insulating layer ISO may be formed to have a width narrower than those of the first and second conductive patterns CP1 and CP2 and the interlayer insulating layers ILD1 and ILD2.

Each of the first pattern P1 and the second pattern P2 is disposed between the isolation insulating layer ISO and the sidewall insulating layer SWI not to surround the channel pillars PCH. According to the above-described structure, the first pattern P1 and the second pattern P2 are opposite to each other with the isolation insulating layer ISO interposed therebetween.

The interlayer insulating layers ILD1 and ILD2 protrude farther toward the sidewall insulating layer SWI than the isolation insulating layer ISO. Accordingly, a gap is provided between the isolation insulating layer ISO and the sidewall insulating layer SWI by a portion of the first interlayer insulating layer ILD1 protruding farther toward a side portion than the isolation insulating layer ISO and a portion of the second interlayer insulating layer ILD2 protruding farther toward a side portion than the isolation insulating layer ISO. The etch stop pattern ES is disposed in the gap. As shown in FIG. 2A, when the etch stop pattern ES overlaps with only partial regions of the first and second conductive patterns CP1 and CP2, a parasitic capacitance caused by the etch stop pattern ES may be reduced.

Referring to FIG. 2B, the etch stop pattern ES may extend in parallel to the first and second conductive patterns CP1 and CP2 and the interlayer insulating layers ILD1 and ILD2 to surround the channel pillars PCH. For instance, the etch stop pattern ES as shown in FIG. 2B occupies a space in which the isolation insulating layer ISO is shown for FIG. 2A.

The etch stop pattern ES, which is described with reference to FIGS. 2A and 2B, remains between the conductive patterns surrounding the channel pillars due to particulars of the manufacturing process. In the present disclosure, the depth to which the slit SI is formed may be precisely controlled using the position at which the etch stop pattern ES is disposed.

According to embodiments described with reference to FIGS. 2A and 2B, a source select transistor is defined at an intersection portion of the source select line SSL and the channel pillar PCH, memory cell transistors are defined at intersection portions of the word lines WL and the channel pillar PCH, and a drain select transistor is defined at an intersection portion of the drain select line DSL and the channel pillar PCH. The source select transistor, the memory cell transistors, and the drain select transistor are connected in series by the channel pillar PCH to form a memory string having a three-dimensional structure. Gate electrodes of the source select transistor, the memory cell transistors, and the drain select transistor correspond to the conductive patterns CP1 and CP2.

Figure 3A:
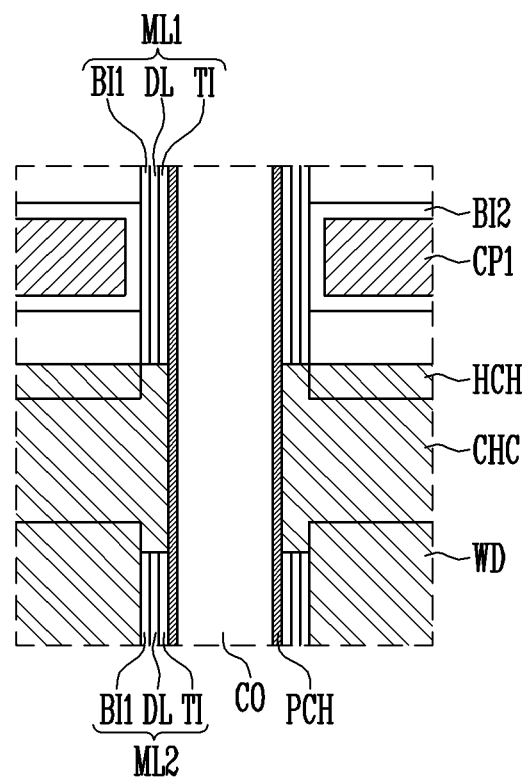
FIGS. 3A and 3B show enlarged views of regions A and B shown in FIGS. 2A and 2B.
Figure 3B:
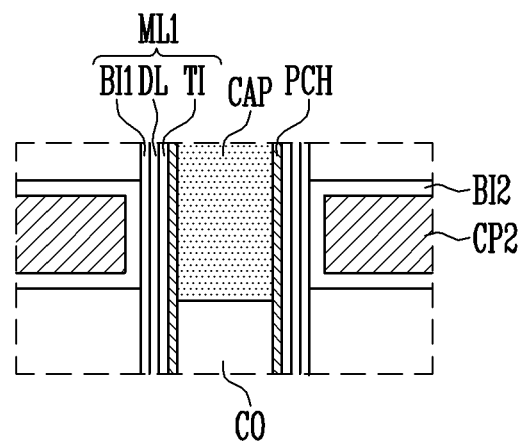

FIGS. 3A and 3B show enlarged views of regions A and B, respectively, which are indicated in FIGS. 2A and 2B. FIG. 3A shows an enlarged sectional view of the region A shown in FIG. 2A and FIG. 2B, and FIG. 3B shows an enlarged sectional view of the region B shown in FIG. 2A and FIG. 2B.

Referring to FIGS. 3A and 3B, each of the first and second multi-layered memory patterns ML1 and ML2 may include a tunnel insulating layer TI, a data storage layer DL, and a first blocking insulating layer BI1, which are stacked on the outer wall of the channel pillar PCH.

The tunnel insulating layer TI may be formed of an insulating layer in which charge tunneling is available. For example, the tunnel insulating layer TI may be formed of a silicon oxide layer.

The data storage layer DL may store data changed using Fowler-Nordheim tunneling caused by a difference in voltage between the word lines WL and the channel pillar PCH, which are shown in FIGS. 2A and 2B. To this end, the data storage layer DL may be formed of various materials. For example, the data storage layer DL may be formed of a nitride layer in which charges can be trapped. In addition, the data storage layer DL may store data in various manners, and may include silicon, a phase change material, nanodots, and the like.

The first blocking insulating layer BI1 may include an oxide layer capable of blocking charges.

Referring to FIG. 3A, the first multi-layered memory pattern ML1 and the second multi-layered memory pattern ML2 may be isolated from each other by the channel contact layer CHC. The channel contact layer CHC that is in contact with the channel pillar PCH, the horizontal channel layer HCH, and the well doped semiconductor layer WD may protrude between the channel pillar PCH and the horizontal channel layer HCH and between the channel pillar PCH and the well doped semiconductor layer WD.

Referring to FIGS. 3A and 3B, the second blocking insulating layer BI2 extending along a surface of each of the first and second conductive patterns CP1 and CP2 may be formed of an insulating material having a dielectric constant higher than a dielectric constant of the first blocking insulating layer BI1. For example, the second blocking insulating layer BI2 may be formed of an aluminum oxide layer. Although not shown in the drawings, a barrier layer for preventing each of the first and second conductive patterns CP1 and CP2 and the second blocking insulating layer BI2 from being in direct contact with each other may be further formed at an interface between each of the first and second conductive patterns CP1 and CP2 and the second blocking insulating layer BI2. The barrier layer may include a titanium nitride layer, a tungsten nitride layer, a tantalum nitride layer, and the like.

The channel pillar PCH may be formed in a shape surrounding the core insulating layer CO and may extend to surround the capping pattern CAP disposed on the core insulating layer CO.

Figure 4A:
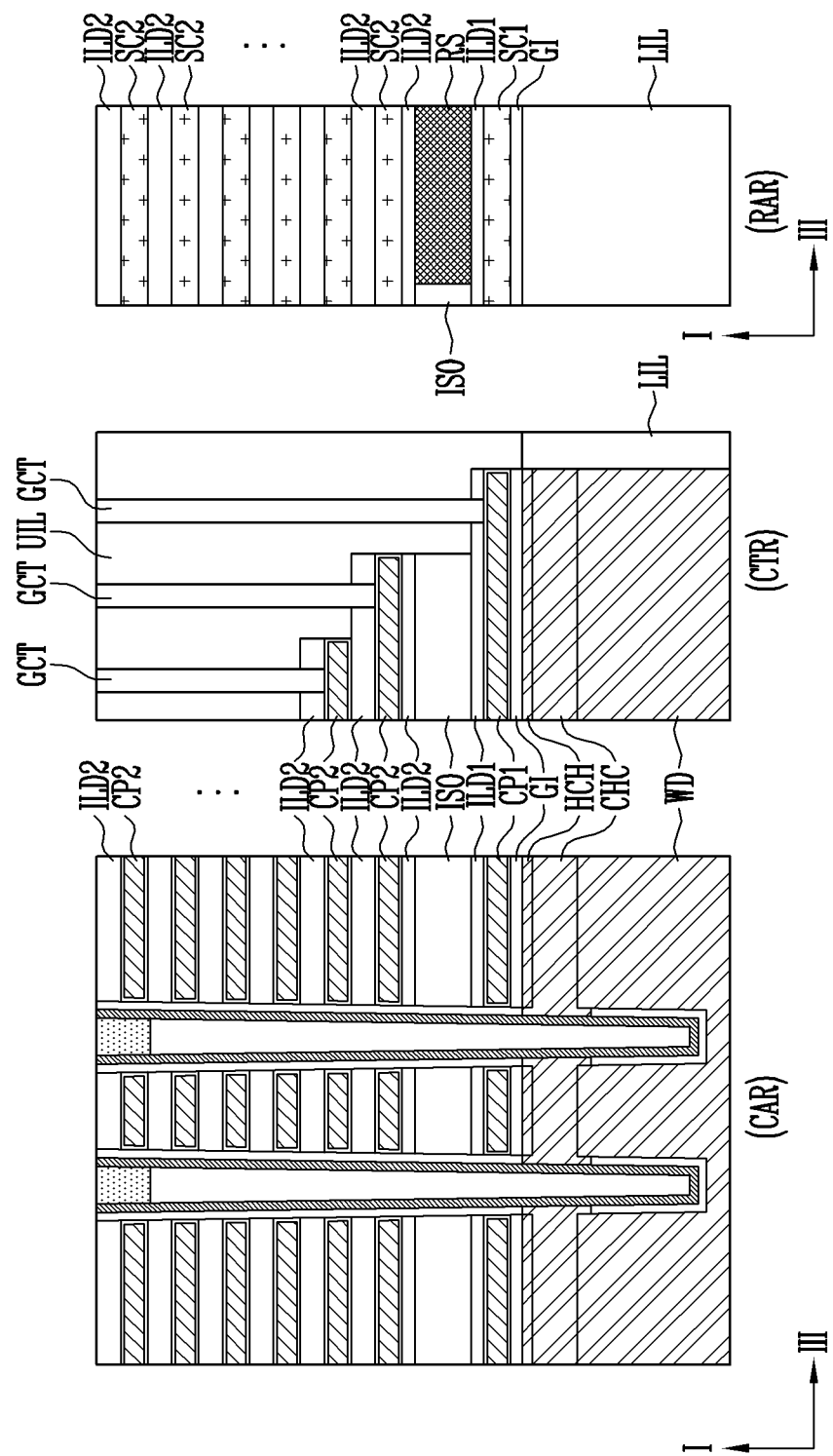
FIGS. 4A and 4B show sectional views illustrating structures for regions of semiconductor devices according to the embodiments of the present disclosure.
Figure 4B:
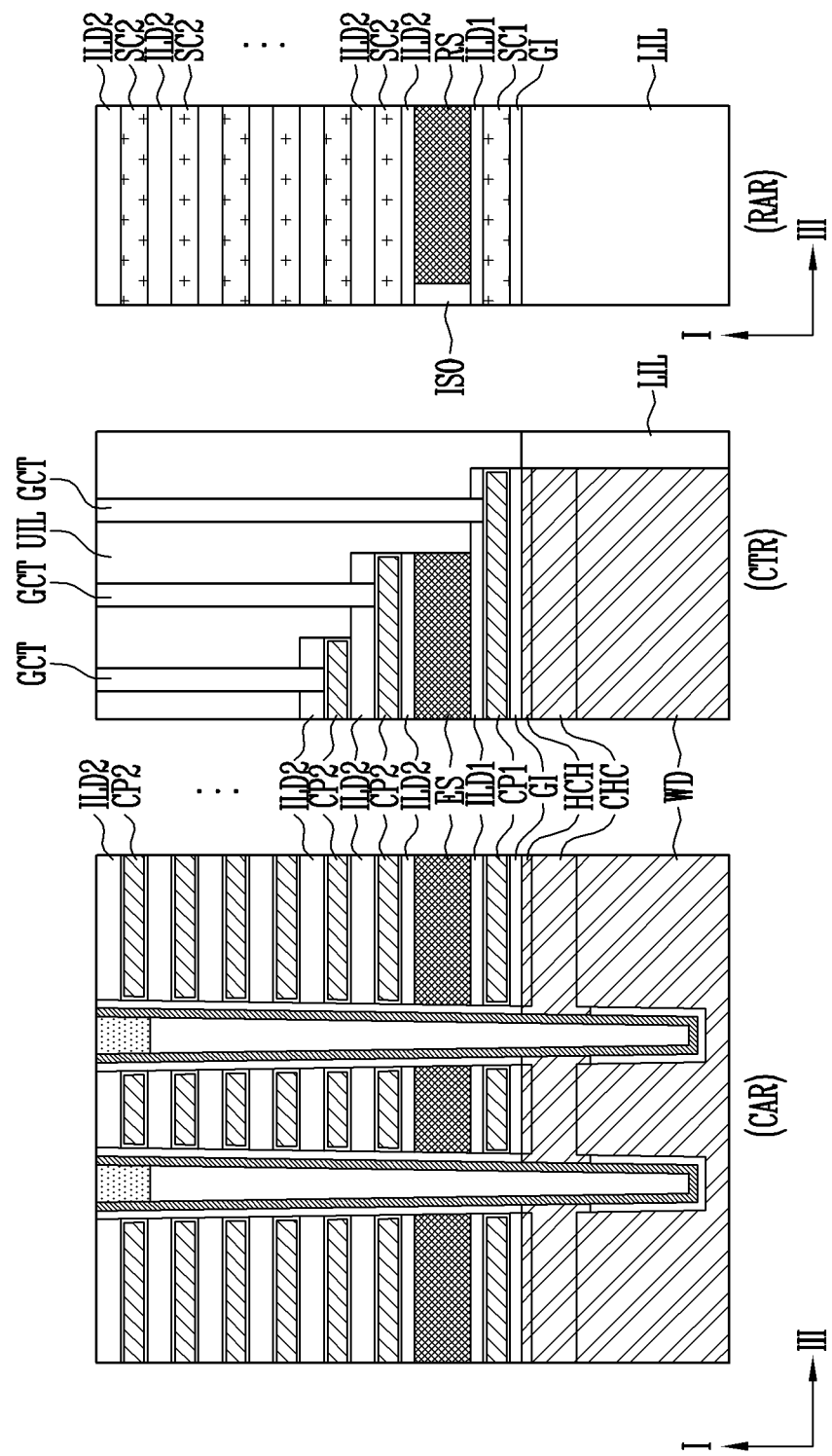

FIGS. 4A and 4B show sectional views illustrating structures for regions of the semiconductor devices according to embodiments of the present disclosure. FIGS. 4A and 4B show sectional views of the regions CAR, CTR, RAR shown in FIG. 1, which are taken along the third direction III. For convenience of description, FIGS. 4A and 4B illustrate only portions of the structures for the regions CAR, CTR, RAR. A structure of the cell array region CAR shown in FIG. 4A corresponds to the cell array region CAR shown in FIG. 2A, and a structure of the cell array region CAR shown in FIG. 4B corresponds to the cell array region CAR shown in FIG. 2B.

Referring to FIGS. 4A and 4B, the well doped semiconductor layer WD in the cell array region CAR extends toward the contact region CTR. A lower insulating layer LIL is disposed in the resistive element region RAR of the same layer as the well doped semiconductor layer WD. The well doped semiconductor layer WD may be isolated from the resistive element region RAR by the lower insulating layer LIL. Although not shown in the drawings, the well doped semiconductor layer WD and the lower insulating layer LIL may be formed on a substrate (not shown) including driving transistors constituting a peripheral circuit.

The channel contact layer CHC and the horizontal channel layer HCH in the cell array region CAR may extend to the contact region CTR.

The gate insulating layer GI, the first conductive pattern CP1, the interlayer insulating layers ILD1 and ILD2, and the second conductive patterns CP2 may extend to the contact region CTR. The gate electrodes including the first conductive pattern CP1 and the second conductive patterns CP2 are stacked in the contact region CTR, forming a staggered, tiered, or step structure.

The first conductive pattern CP1 and the second conductive patterns CP2, which are exposed through the step structure in the contact region CTR, may be covered by a planarization insulating layer UIL. The planarization insulating layer UIL may be penetrated by gate contact plugs GCT disposed in the contact region CTR. The gate contact plugs GCT may extend in the first direction I to be in contact with the first conductive pattern CP1 and the second conductive patterns CP2 and may penetrate at least one interlayer insulating layer ILD1 or ILD2 and the planarization insulating layer UIL.

A resistor pattern RS disposed in the resistive element region RAR is disposed in the same layer as the isolation layer ISO and the etch stop pattern ES. To simplify a manufacturing process, the resistor pattern RS and the etch stop pattern ES may be formed by patterning a single poly-silicon layer. The first conductive layer may be a poly-silicon layer. Therefore, the resistor pattern RS may be formed to have a thickness equal to that of the etch stop pattern ES. As a result, the resistor pattern RS may be formed thicker than each of the first conductive pattern CP1 and the second conductive patterns CP2.

The gate insulating layer GI and the interlayer insulating layers ILD1 and ILD2 may be disposed in the resistive element region RAR to overlap with the resistor pattern RS. If the gate insulating layer GI and the interlayer insulating layers ILD1 and ILD2 in the resistive element region RAR represent dummy insulating layers, then sacrificial insulating layers SC1 and SC2 may remain between the dummy insulating layers. The sacrificial insulating layers SC1 and SC2 are disposed in the same layer as the first and second conductive patterns CP1 and CP2 and overlap with the resistor pattern RS.

The sacrificial insulating layers SC1 and SC2 are material layers that remain following a process of manufacturing a semiconductor layer, and the sacrificial insulating layers SC1 and SC2 may be nitride layers. The sacrificial insulating layers SC1 and SC2 may be divided into a first sacrificial insulating layer SC1 and second sacrificial insulating layers SC2. The first sacrificial insulating layer SC1 is disposed under the resistor pattern RS and is disposed in the same layer as the first conductive pattern CP1. The second sacrificial insulating layers SC2 are disposed above the resistor pattern RS and are disposed in the same layers as the second conductive patterns CP2.

The resistor pattern RS, the sacrificial insulating layers SC1 and SC2, and the dummy insulating layers may be disposed on the lower insulating layer LIL in the resistive element region RAR. The gate insulating layer GI and the interlayer insulating layers ILD1 and ILD2 disposed in the resistive element region RAR constitute the dummy insulating layers. According to the above-described structure, the resistor pattern RS is disposed between the first sacrificial insulating layer SC1 and the second sacrificial insulating layer SC2, which are adjacent to each other in the first direction I. The resistor pattern RS may remain thicker than each of the first sacrificial insulating layer SC1 and the second sacrificial insulating layers SC2.

Figure 5:
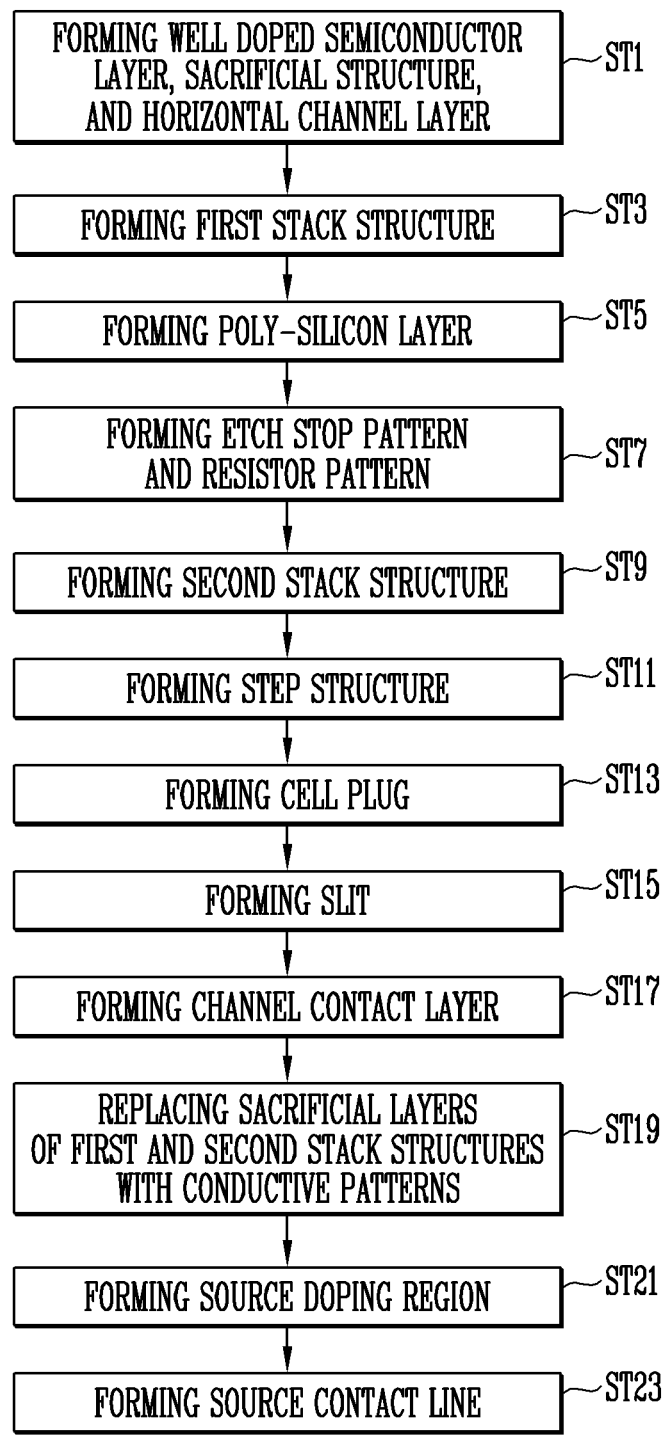
FIG. 5 shows a flowchart schematically illustrating a manufacturing method of a semiconductor device according to an embodiment of the present disclosure.

FIG. 5 shows a flowchart schematically illustrating a manufacturing method of a semiconductor device according to a number of embodiments of the present disclosure.

Referring to FIG. 5, the manufacturing method of the semiconductor device may include operations ST1 to ST23. For some embodiments, driving transistors constituting a driving circuit for driving the semiconductor device may be formed on a substrate before the operation ST1 is performed. In this case, the operation ST1 may be performed on the substrate including the driving transistors. For some embodiments, contact plugs including gate contact plugs may be formed and signal lines including bit lines may be formed after the operation ST23 is performed.

Operation ST1 includes forming a well doped semiconductor layer, a sacrificial structure, and a horizontal channel layer in the first region AR1 shown in FIG. 1.

Operation ST3 includes forming a first stack structure. For some embodiments, the first stack structure is entirely formed in the first region AR1 and the second region AR2, which are shown in FIG. 1.

Operation ST5 includes forming a poly-silicon layer. For some embodiments, the poly-silicon layer is entirely formed in the first region AR1 and the second region AR2, which are shown in FIG. 1.

Operation ST7 includes forming an etch stop pattern and a resistor pattern. For example, a poly-silicon etch stop pattern is disposed in the first region AR1 shown in FIG. 1 and the resistor pattern is disposed in the second region AR2 shown in FIG. 1.

Operation ST9 includes forming a second stack structure. For some embodiments, the second stack structure is entirely formed in the first region AR1 and the second region AR2, which are shown in FIG. 1.

Operation ST11 includes forming a step structure. The step structure is formed in the contact region CTR shown in FIG. 1. For the operation ST11, each of the first and second stack structures may be divided into a cell pattern disposed in the first region AR1 shown in FIG. 1 and a dummy pattern disposed in the second region AR2 shown in FIG. 1.

Operation ST13 includes forming a cell plug penetrating a cell stack structure. The cell plug is formed in the cell array region CAR shown in FIG. 1.

Operation ST15 includes forming a slit penetrating the cell stack structure. The slit may extend from the cell array region CAR shown in FIG. 1 to the contact region CTR shown in FIG. 1.

Operation ST17 includes forming a channel contact layer through the slit. The channel contact layer is formed in the first region AR1 shown in FIG. 1.

Operation ST19 includes replacing sacrificial layers of the first and second stack structures with conductive patterns.

The sacrificial layers replaced with the conductive patterns are sacrificial layers constituting the cell pattern. The sacrificial layers of the first and second stack structures representing dummy patterns remain in the second region AR2 shown in FIG. 1 and are not replaced with the conductive patterns.

Operation ST21 includes forming a source doping region through the slit.

Operation ST23 includes forming a source contact line that is in contact with the source doping region.

Hereinafter, manufacturing methods of semiconductor devices according to embodiments of the present disclosure are described in detail with reference to FIGS. 6A, 6B, 7, 8, 9, 10A to 10D, 11A to 11D, 12A, 12B, and 13A to 13C, or with reference to FIGS. 14A and 14B. A cell array region CAR, a resistive element region RAR, and a contact region CTR, which are shown in FIGS. 6A, 6B, 7, 8, 9, 10A to 10D, 11A to 11D, 12A, 12B, 13A to 13C, 14A and 14B, are the same as described for FIG. 1, and therefore, descriptions of the regions CAR, RAR, and CTR are omitted here.

FIGS. 6A, 6B, 7, 8, 9, 10A to 10D, 11A to 11D, 12A, 12B, and 13A to 13C illustrate an embodiment of a manufacturing method of the semiconductor device shown in FIGS. 2A and 4A.

Figure 6A:
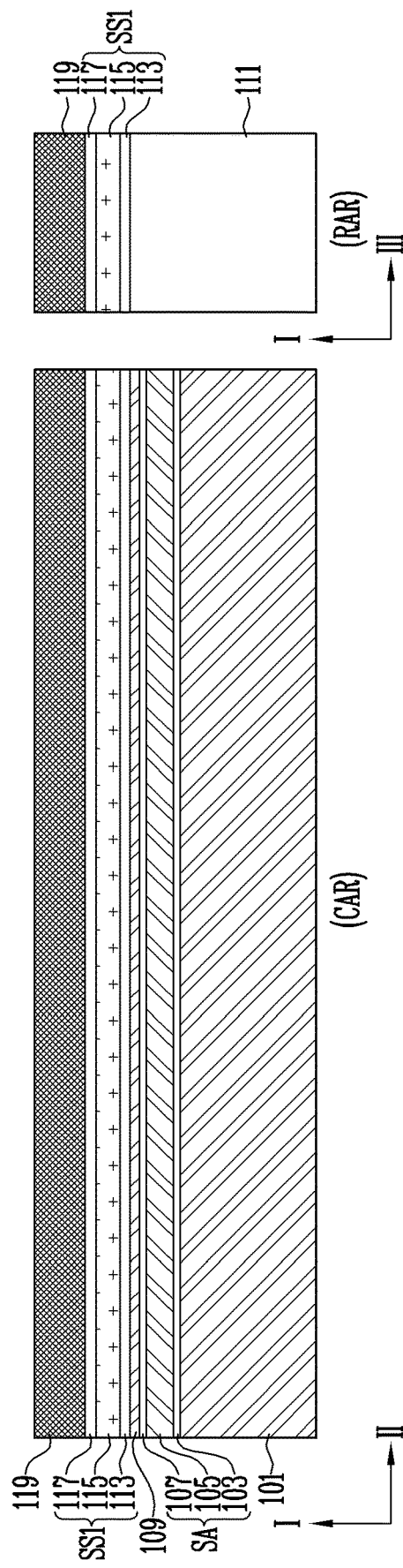
Figure 6B:
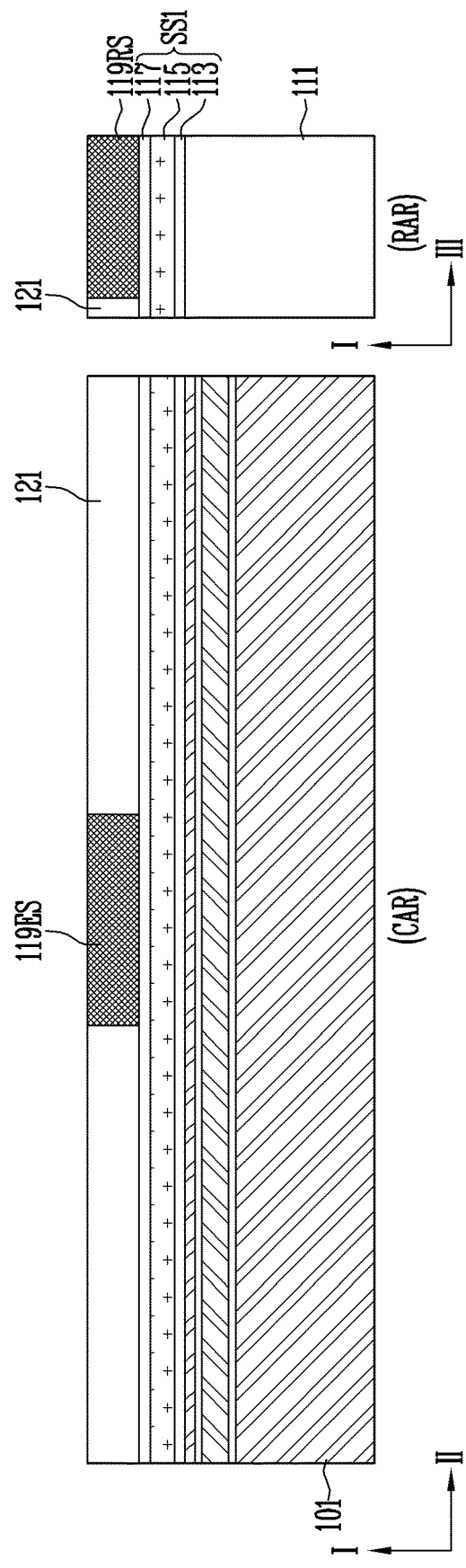

FIGS. 6A and 6B show sectional views illustrating the operations ST1 to ST7 indicated in FIG. 5.

Referring to FIG. 6A, the operation ST1 may include: forming a well doped semiconductor layer 101; forming a sacrificial structure SA on the well doped semiconductor layer 101; forming a horizontal channel layer 109 on the sacrificial structure SA; removing the well doped semiconductor layer 101, the sacrificial structure SA, and the horizontal channel layer 109 in the resistive element region RAR; and forming a lower insulating layer 111 in the resistive element region RAR.

Forming the well doped semiconductor layer 101 may include forming a first semiconductor layer and forming a second semiconductor layer. The first semiconductor layer may be a doped silicon layer including a first conductivity type dopant. The first conductivity type dopant may be a p-type dopant for forming a well body. The second semiconductor layer may be an undoped silicon layer. The first conductivity type dopant in the first semiconductor layer may be diffused into the second semiconductor layer by heat generated while a subsequent process is being performed or a separate heat treatment process. As a result, the concentration of the first conductivity type dopant may gradually decrease with proximity to an upper portion in the well doped semiconductor layer 101.

Forming the sacrificial structure SA may include forming a first protective layer 103 on the well doped semiconductor layer 101, forming a lower sacrificial layer 105 on the first protective layer 103, and forming a second protective layer 107 on the lower sacrificial layer 105. The lower sacrificial layer 105 may be formed of an undoped silicon layer. The first protective layer 103 and the second protective layer 107 may be formed of any material selected from materials having an etching rate different from that of the lower sacrificial layer 105. For example, the first protective layer 103 and the second protective layer 107 may be formed of an oxide layer. The first protective layer 103 and the second protective layer 107 may protect the well doped semiconductor layer 101 and the horizontal channel layer 109 during a subsequent process of removing the lower sacrificial layer 105. At least one of the first protective layer 103 and the second protective layer 107 may be omitted in some cases.

The horizontal channel layer 109 protects a gate insulating layer 113 while a multi-layered memory layer is being etched in a subsequent process, thereby preventing loss of the gate insulating layer 113. The horizontal channel layer 109 may be formed of a semiconductor layer. For example, the horizontal channel layer 109 may be formed of a silicon layer. The horizontal channel layer 109 may be formed of a doped semiconductor layer or an undoped semiconductor layer. The horizontal channel layer 109 deposited in an undoped state may include a first conductivity type dopant diffused from the well doped semiconductor layer 101 by heat generated in a subsequent process or a separate heat treatment process.

The horizontal channel layer 109 and the well doped semiconductor layer 101 may be used as seed layers in a subsequent process for the growth of a channel contact layer.

The well doped semiconductor layer 101, the sacrificial structure SA, and the horizontal channel layer 109 are removed in the resistive element region RAR and remain in the first region AR1, which includes the cell array region CAR and the contact region (see CTR of FIG. 1). The lower insulating layer 111 is formed in the resistive element region RAR to fill in the region in which the well doped semiconductor layer 101, the sacrificial structure SA, and the horizontal channel layer 109 are etched. Accordingly, the lower insulating layer 111 includes a sidewall that forms a common surface with sidewalls of the well doped semiconductor layer 101, the sacrificial structure SA, and the horizontal channel layer 109.

A first stack structure SS1 formed during operation ST3 is formed to cover the horizontal channel layer 109 and the lower insulating layer 111. The operation ST3 may include forming the gate insulating layer 113, forming a first sacrificial layer 115 on the gate insulating layer 113, and forming a first interlayer insulating layer 117 on the first sacrificial layer 115.

The first sacrificial layer 115 may be formed of any material having an etching rate different from that of the gate insulating layer 113 and the first interlayer insulating layer 117. The gate insulating layer 113 and the first interlayer insulating layer 117 may include a silicon oxide layer. The first sacrificial layer 115 may include a nitride layer.

A poly-silicon layer 119 formed during operation ST5 is disposed on the first stack structure SS1. The poly-silicon layer 119 may serve as an etch stop layer in the cell array region CAR while a subsequent process for forming a slit is being performed. The poly-silicon layer 119 may be used as a resistor pattern in the resistive element region RAR. The poly-silicon layer 119 may be a doped poly-silicon layer doped with an n-type dopant.

Referring to FIG. 6B, during operation ST7, the poly-silicon layer 119 is etched. Accordingly, the poly-silicon layer 119 remains as an etch stop pattern 119ES in the cell array region CAR and remains as a resistor pattern 119RS in the resistive element region RAR. The resistor pattern 119RS is electrically isolated from the etch stop pattern 119ES. The region in which the poly-silicon layer 119 is etched may be filled with an isolation insulating layer 121.

The etch stop pattern 119ES overlaps the well doped semiconductor layer 101. For some embodiments, the etch stop pattern 119ES does not remain in regions in which cell plugs are to be disposed but may remain in a region in which a slit is to be disposed. The resistor pattern 119RS does not overlap the well doped semiconductor layer 101 but does overlap the lower insulating layer 111.

The etch stop pattern 119ES and the resistor pattern 119RS are formed using a photoresist process. Thus, for embodiments of the present disclosure, the manufacturing process of the semiconductor device may be simplified.

Figure 7:
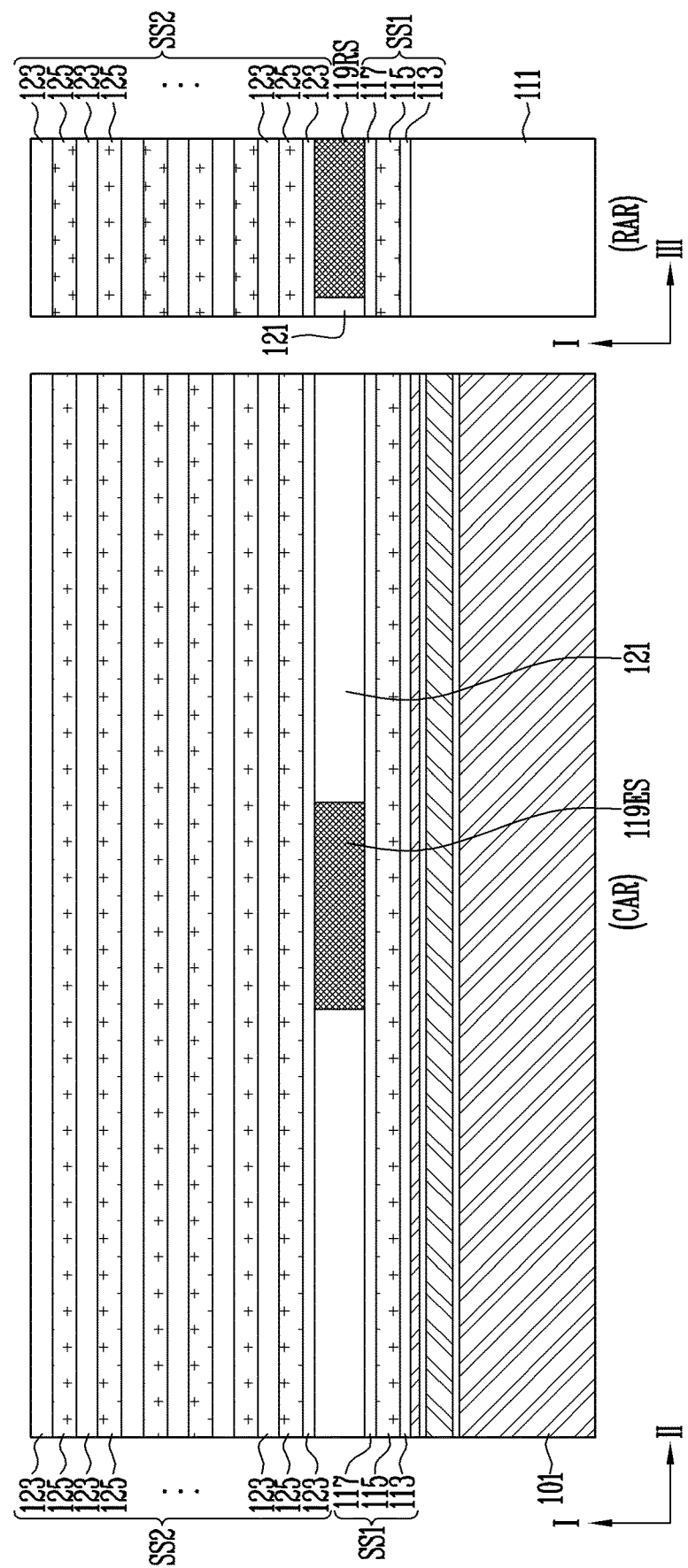

FIG. 7 shows a sectional view illustrating the operation ST9 shown in FIG. 5.

Referring to FIG. 7, a second stack structure 552 formed during the operation ST9 extends along top surfaces of the etch stop pattern 119ES, the isolation insulating layer 121, and the resistor pattern 119RS. That is, the second stack structure 552 extends from the cell array region CAR to the resistive element region RAR.

Operation ST9 may include alternately stacking second interlayer insulating layers 123 and second sacrificial layers 125 one-by-one. The second interlayer insulating layers 123 may be formed of the same material as the first interlayer insulating layer 117, and the second sacrificial layers 125 may be formed of the same material as the first sacrificial layer 115. The second interlayer insulating layers 123 may include a silicon oxide layer. The second sacrificial layers 125 may include a nitride layer.

Each of the first stack structure SS1 and the second stack structure SS2 may be divided into a portion disposed in the first region AR1 shown in FIG. 1 and a portion disposed in the second region AR2 shown in FIG. 1. Hereinafter, for convenience of description, the portion of the first stack structure SS1 disposed in the first region AR1 is defined as a first region of the first stack structure SS1, and the portion of the first stack structure SS1 disposed in the second region AR2 is defined as a second region of the first stack structure SS1. In addition, the portion of the second stack structure SS2 disposed in the first region AR1 is defined as a first region of the second stack structure SS2, and the portion of the second stack structure SS2 disposed in the second region AR2 is defined as a second region of the second stack structure SS2, The first region of the first stack structure SS1 and the first region of the second stack structure SS2 overlap with the well doped semiconductor layer 101, and the second region of the first stack structure SS1 and the second region of the second stack structure 552 do not overlap with the well doped semiconductor layer 101.

Figure 8:
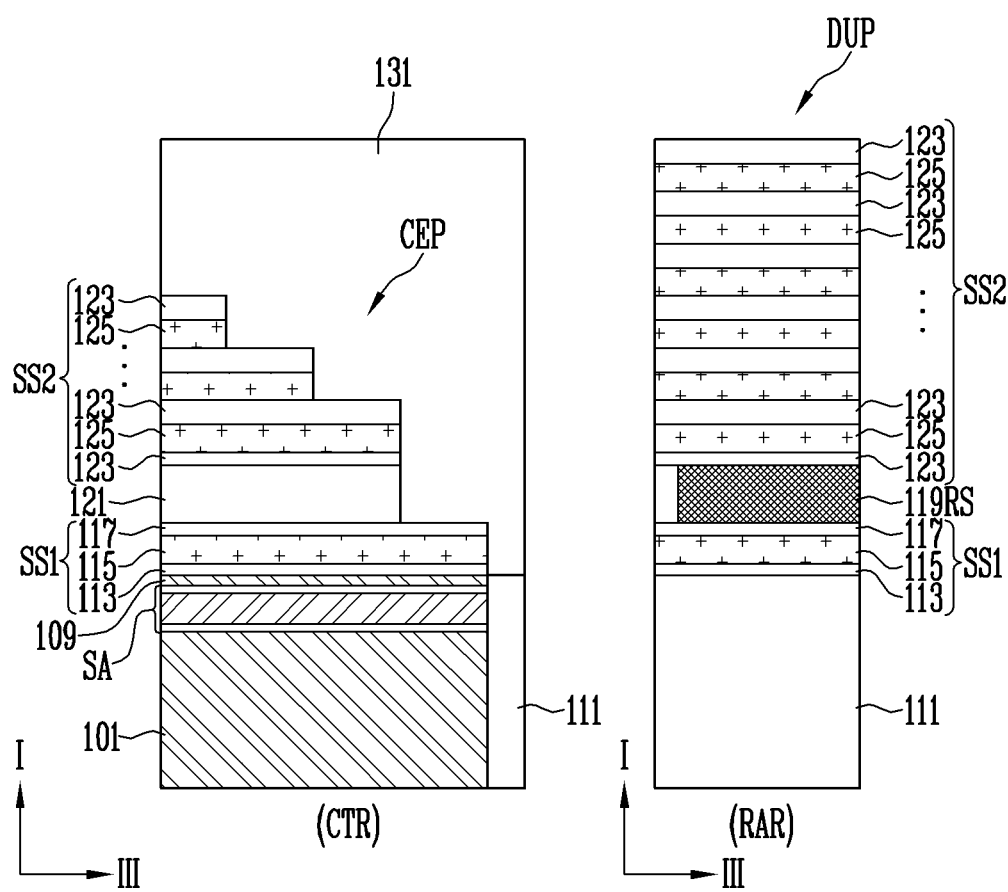

FIG. 8 shows a sectional view illustrating the operation 511 shown in FIG. 5.

Referring to FIG. 8, for the operation ST11, the first stack structure SS1 and the second stack structure SS2 may be etched. Each of the first stack structure SS1 and the second stack structure SS2 may be divided into a cell pattern CEP remaining in the first region AR1 shown in FIG. 1 and a dummy pattern DUP remaining in the second region AR2 shown in FIG. 2. An end portion of the cell pattern CEP remaining in the first region AR1 may be disposed in the contact region CTR and may have a staggered, tiered, or step structure. Forming the step structure may include forming a photoresist pattern (not shown) and etching the first stack structure SS1 and the second stack structure SS2 through an etching process using the photoresist pattern as an etching barrier. The step structure may be formed by repeatedly decreasing the size of the photoresist pattern and etching the first stack structure SS1 and the second stack structure SS2 using the photoresist pattern.

After the cell pattern CEP and the dummy pattern DUP are divided, a planarization insulating layer 131 may be formed to cover the step structure formed at the end portion of the cell pattern CEP. The cell pattern CEP overlaps with the well doped semiconductor layer 101, and the dummy pattern DUP does not overlap with the well doped semiconductor layer 101.

FIG. 9 shows a sectional view illustrating the operation ST13 indicated in FIG. 5.

Referring to FIG. 9, the operation ST13 may include etching for forming holes 133 and forming cell plugs PL in the holes 133. The holes 133 may extend to the inside of the well doped semiconductor layer 101 by penetrating the second stack structure SS2 constituting the cell pattern CEP, the isolation insulating layer 121, the first stack structure SS1 constituting the cell pattern CEP, the horizontal channel layer 109, and the sacrificial structure SA.

Forming the cell plugs PL may include forming a channel pillar 137 surrounded by a multi-layered memory layer 135 in each of the holes 133. Forming the channel pillar 137 surrounded by the multi-layered memory layer 135 may include forming the multi-layered memory layer 135 on a surface of each of the holes 133 and forming a channel semiconductor layer on the multi-layered memory layer 135. A portion of each of the multi-layered memory layer 135 and the channel semiconductor layer at the outside of the holes 133 may be removed. The multi-layered memory layer 135 may be formed by sequentially stacking the first blocking insulating layer, the data storage layer, and the tunnel insulating layer, which are described with reference to FIGS. 3A and 3B. The channel semiconductor layer may be formed of an undoped silicon layer.

The channel pillar 137 may be formed to completely fill in each of the holes 133 or may be formed so a central region of each of the holes 133 is opened therethrough.

When the central region of each of the holes 133 is opened by the channel pillar 137, forming the cell plugs PL may further include filling the central region of each of the holes 133 with a core insulating layer 139. In this case, forming the cell plugs PL may further include forming a capping pattern 141 on the core insulating layer 139. To this end, an upper end of each of the holes 133 may be opened by allowing an upper end of the core insulating layer 139 to be recessed. Therefore, the height of the core insulating layer 139 may be formed lower than the height of each of the holes 133 and the height of the channel pillar 137. Subsequently, the capping pattern 141 filling in the upper end of each of the holes 133 may be formed on the core insulating layer 139, the height of which is lowered. The capping pattern 141 may be formed of a doped silicon layer including a second conductivity type dopant.

The cell plugs PL may penetrate the isolation insulating layer 121 in the cell array region CAR. The cell plugs PL may be divided into a first group GR1 and a second group GR2. The first group GR1 and the second group GR2 may be disposed with the etch stop pattern 119ES interposed therebetween.

FIGS. 10A to 10D show sectional views illustrating the operation ST15 indicated in FIG. 5.

Figure 10A:
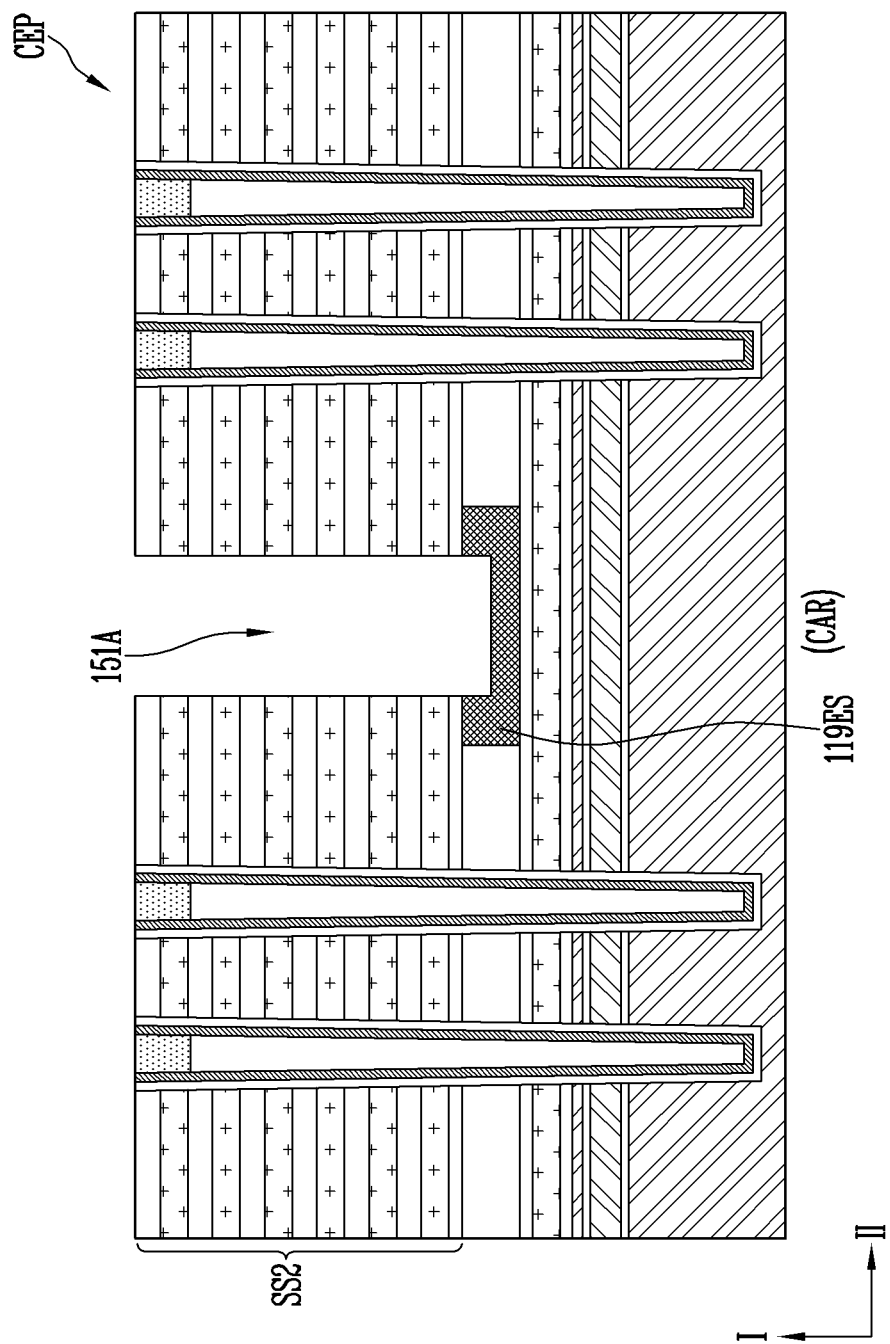

Referring to FIG. 10A, the operation ST15 may include forming a first through part 151A by etching the second stack structure SS2 constituting the cell pattern CEP. The first through part 151A is a portion of the slit SI and is formed by an etch process exploiting a difference in etching rate between the material layers constituting the second stack structure 552 and the etch stop pattern 119ES. The first through part 151A overlaps the etch stop pattern 119ES. While forming the first through part 151A, the etch stop pattern 119ES serves as an etch stop layer.

The etch stop pattern 119ES is formed thick enough to serve as an etch stop layer. Thus, although a portion of the etch stop pattern 119ES is lost to an etching material for etching the second stack structure SS2, the etch stop pattern 119ES is not completely penetrated by the first through part 151A.

Referring to FIG. 10B, the operation ST15 may include forming a second through part 151B by etching the etch stop pattern 119ES. The second through part 151B is connected to the first through part 151A and forms a portion of the slit SI. The second through part 151B exposes the first interlayer insulating layer 117 of the first stack structure 551. The etch stop pattern 119ES may be divided into a first pattern P1 and a second pattern P2 by the second through part 151B. While the second through part 151B is being formed, the material layers of the first stack structure SS1 may be used as etch stop layers by exploiting a difference in etching rate between the material layers constituting the first stack structure SS1 and the etch stop pattern 119ES.

The operation ST15 may further include forming a first oxidation region 153 by oxidizing a sidewall of each of the first pattern P1 and the second pattern P2, which are exposed by the second through part 151B.

Referring to FIG. 10C, the operation ST15 may include forming a third through part 151C by etching the first stack structure SS1 constituting the cell pattern CEP. The third through part 151C forms a portion of the slit SI. The third through part 151C is connected to the second through part 151B and exposes a top surface of the horizontal channel layer 109.

While the third through part 151 is formed, the horizontal channel layer 109 may be used as an etch stop layer by exploiting a difference in etching rate between the material layers constituting the first stack structure SS1 and the horizontal channel layer 109.

Figure 10D:
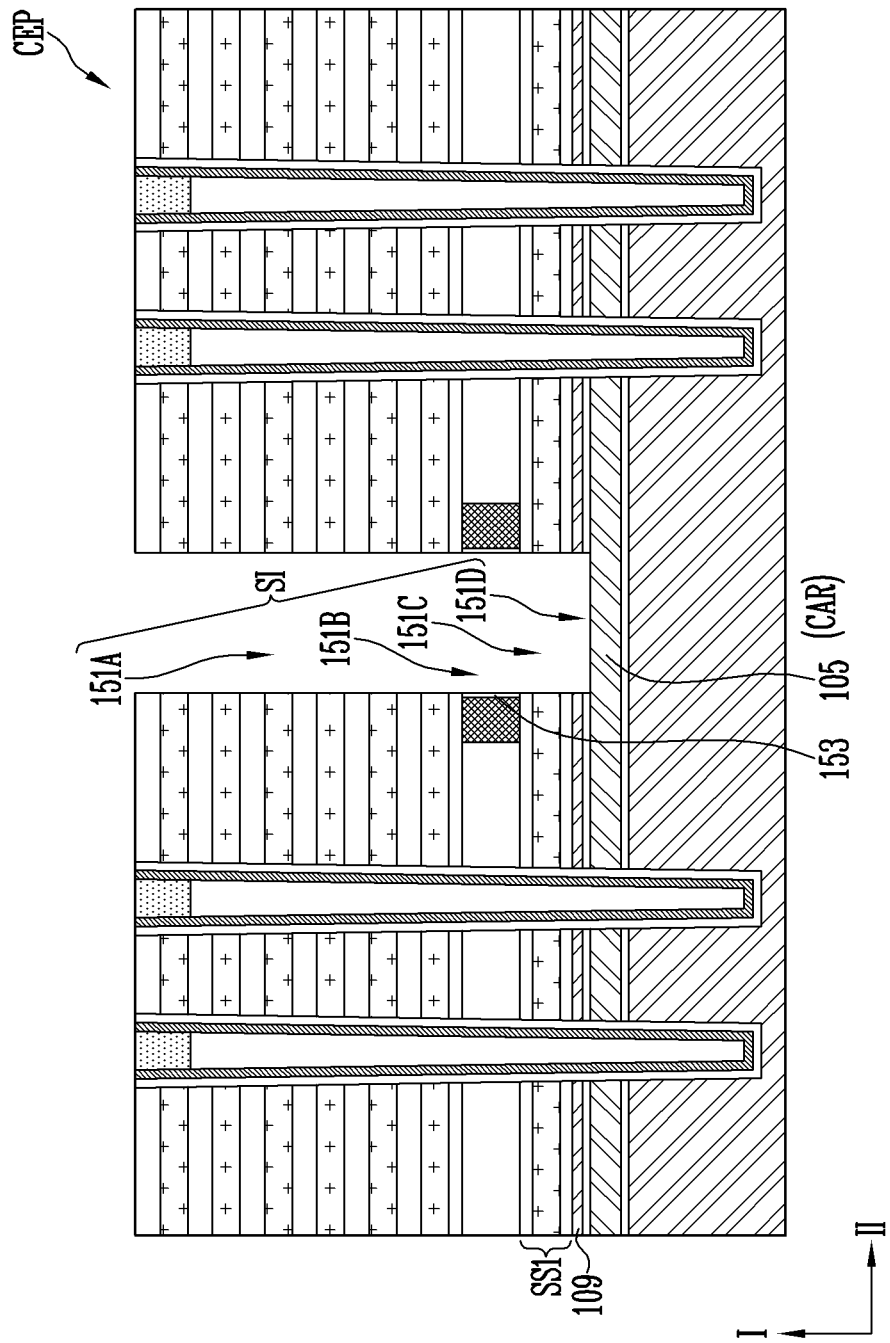

Referring to FIG. 10D, the operation ST15 may include forming a fourth through part 151D by etching the horizontal channel layer 109. The fourth through part 151D is connected to the third through part 151C and forms a portion of the slit SI. The fourth through part 151D exposes the lower sacrificial layer 105 of the sacrificial structure SA.

The first to fourth through parts 151A to 151D described for FIGS. 10A to 10D are connected to each other, extend in the third direction III described in FIG. 2A, and constitute a slit SI. According to an embodiment of the present disclosure, the etch stop pattern 119ES is disposed between the first stack structure SS1 and the second stack structure SS2. Accordingly, the etching process forming the slit SI is divided into a first etching operation using the etch stop pattern 119ES as an etch stop layer and a second etching operation using the first stack structure SS1 as an etch stop layer, so that the first and second etching operations may be performed in succession. As a result, the depth of the slit SI may be precisely controlled through a simplified process.

FIGS. 11A to 11D show sectional views illustrating the operation ST17 indicated in FIG. 5.

Figure 11A:
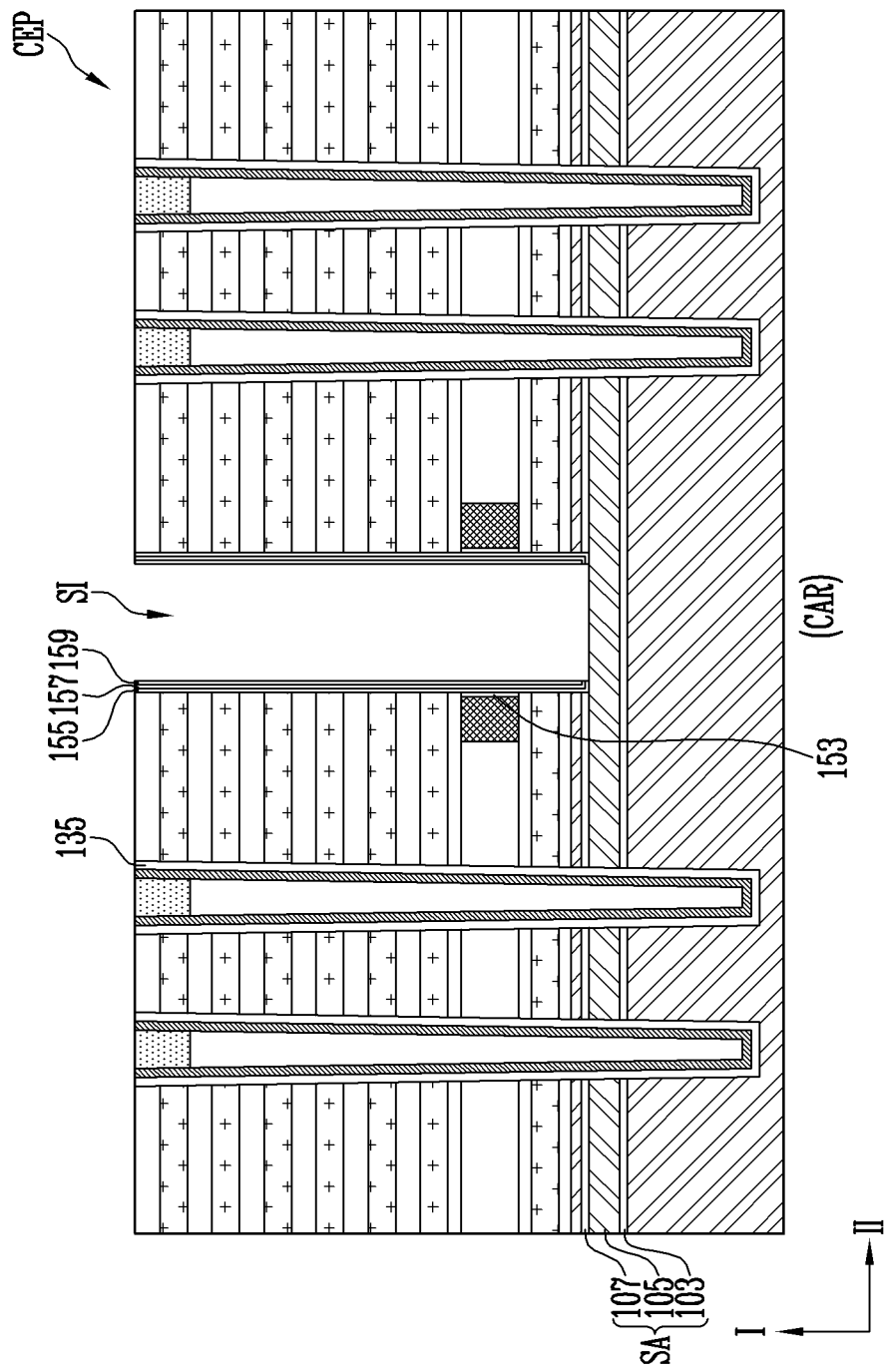

Referring to FIG. 11A, the operation ST17 may include forming first to third sidewall protective layers 155, 157, and 159 on a sidewall of the slit SI.

The first to third sidewall protective layers 155, 157, and 159 may be formed by sequentially depositing first to third thin films on a surface of the slit SI and then removing a portion of each of the first to third thin films such that the lower sacrificial layer 105 of the sacrificial structure SA is exposed through a bottom surface of the slit SI, The first thin film remains as the first sidewall protective layer 155, the second thin film remains as the second sidewall protective layer 157, and the third thin film remains as the third sidewall protective layer 159.

The first sidewall protective layer 155 may be formed of an insulating material having an etching rate different from an etching rate of the first blocking insulating layer of the multi-layered memory layer 135. The second sidewall protective layer 157 may be formed of an insulating material having an etching rate different from an etching rate of the data storage layer of the multi-layered memory layer 135. The third sidewall protective layer 159 may be formed of an insulating material having an etching rate different from an etching rate of the tunnel insulating layer of the multi-layered memory layer 135. The first sidewall protective layer 155 and the third sidewall protective layer 159 may be formed of the same material as the data storage layer of the multi-layered memory layer 135. For example, the second sidewall protective layer 157 may be formed of an oxide layer, and the first sidewall protective layer 155 and the third sidewall protective layer 159 may be formed of a silicon nitride layer.

Referring to FIG. 11B, for the operation ST17, the sacrificial structure SA may be removed through the slit SI, a portion of the multi-layered memory layer 135 may be etched, and a horizontal space HSP that exposes a sidewall of the channel pillar 137 may be opened.

Removing the sacrificial structure SA may include exposing a sidewall of the multi-layered memory layer 135 by removing the lower sacrificial layer 105 shown in FIG. 11A through the slit SI. While the lower sacrificial layer 105 is being removed, the horizontal channel layer 109 and the well doped semiconductor layer 101 may be protected by the first protective layer 103 and the second protective layer 107, which are shown in FIG. 11A.

As the lower sacrificial layer is removed, a portion of the multi-layered memory layer 135 is exposed. The exposed multi-layered memory layer 135 may be etched to be divided into a first multi-layered memory pattern 135A and a second multi-layered memory pattern 135B. The horizontal space HSP is defined in the region in which the lower sacrificial layer and the multi-layered memory layer 135 are removed. The channel pillar 137 is exposed between the first multi-layered memory pattern 135A and the second multi-layered memory pattern 135B.

While the multi-layered memory layer 135 is being etched, the first protective layer 103 and the second protective layer 107, which are shown in FIG. 11A, are removed. Therefore, the horizontal channel layer 109 and the well doped semiconductor layer 101 may be exposed by the horizontal space HSP. While the multi-layered memory layer 135 is being etched, the third sidewall protective layer 159 and the second sidewall protective layer 157, which are shown in FIG. 11A, may be removed, but the first sidewall protective layer 155 remains, thereby protecting the first stack structure SS1 and the second stack structure SS2.

Figure 11C:
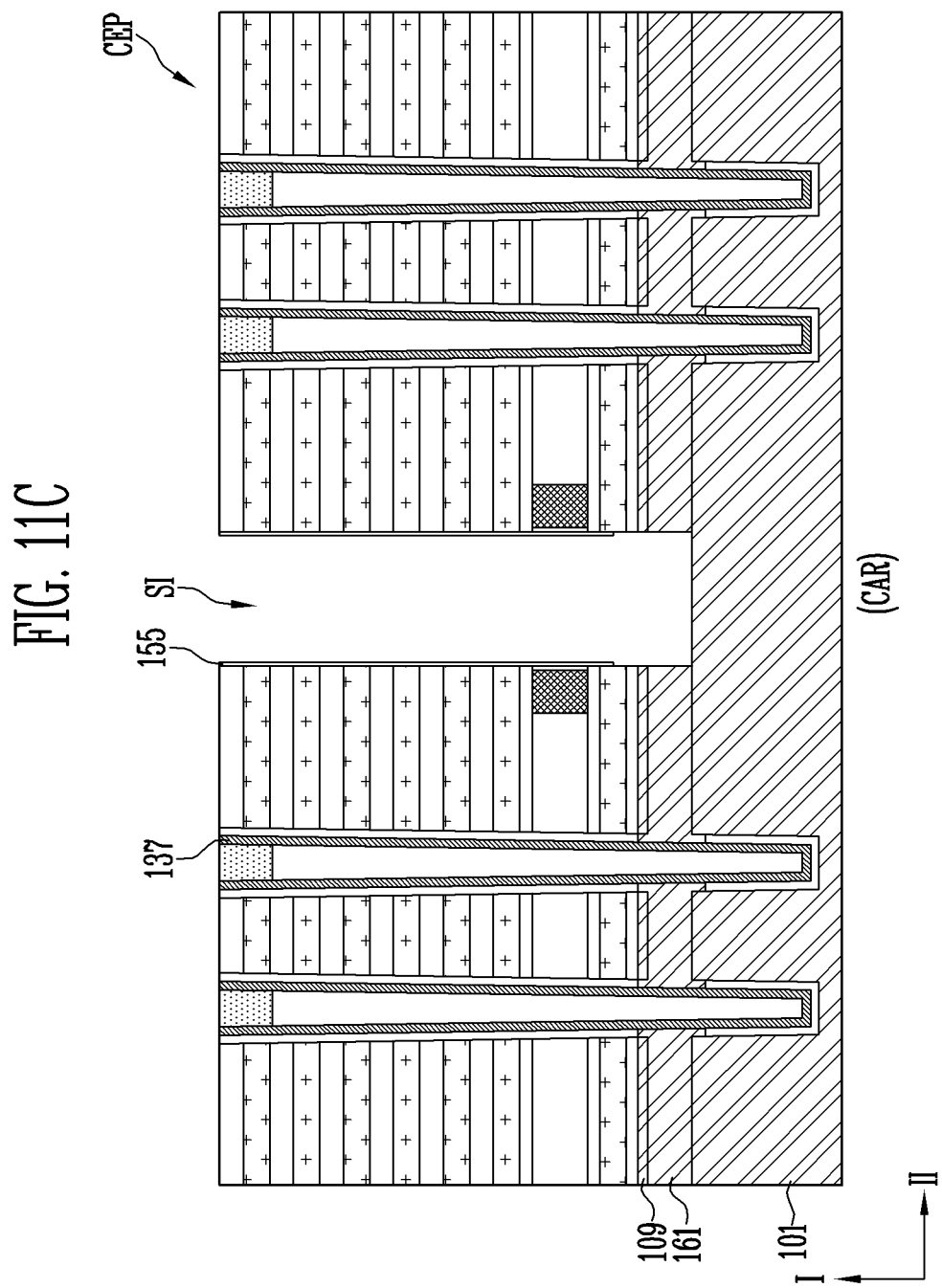

Referring to FIG. 11C, the operation ST17 may include filling the horizontal space HSP shown in FIG. 11B with a channel contact layer 161. The channel contact layer 161 is in direct contact with a sidewall of the channel pillar 137, a bottom surface of the horizontal channel layer 109, and a top surface of the well doped semiconductor layer 101. The channel contact layer 161 may be formed of a doped semiconductor layer or an undoped semiconductor layer. The channel contact layer 161 may be formed of a silicon layer. In a subsequent process, the first conductivity type dopant in the well doped semiconductor layer 101 may be diffused into the channel contact layer 161.

The channel contact layer 161 may be formed using selective growth (e.g., selective epitaxial growth (SEG)) or deposition process (e.g., chemical vapor deposition (CVD)). When selective growth is used, the channel pillar 137, the horizontal channel layer 109, and the well doped semiconductor layer 101 may serve as seed layers. When a deposition process is used, the channel contact layer 161 may extend to the sidewall of the slit SI. In this case, a partial region of the channel contact layer 161 formed in the slit SI may be removed.

Referring to FIG. 11D, the operation ST17 may further include forming a second oxidation region 163 by oxidizing a surface of each of the horizontal channel layer 109, the channel contact layer 161, and the well doped semiconductor layer 101, which are exposed through the slit SI.

Figure 12B:
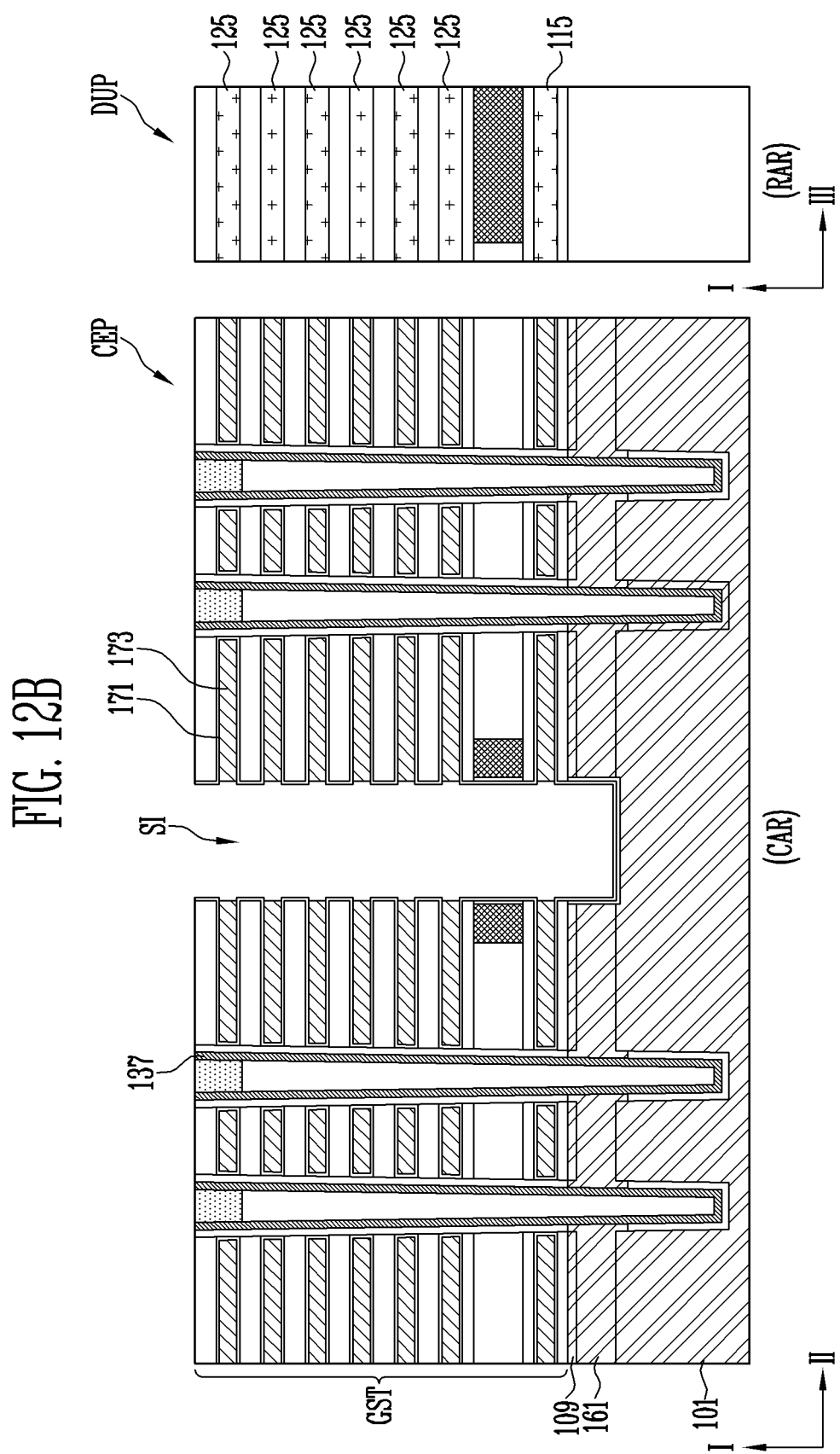

FIGS. 12A and 12B show sectional views illustrating the operation ST19 indicated in FIG. 5.

Referring to FIG. 12A, the operation ST19 may include removing the first side all protective layer and forming recess regions RA by removing the first and second sacrificial layers 115 and 125 through the slit SI. The recess regions RA are defined only in regions for which the first and second sacrificial layers 115 and 125 of the cell pattern CEP are removed. The recess regions RA may be defined between the gate insulating layer 113 and the first interlayer insulating layer 117, which are adjacent to each other in the first direction I, or between the second interlayer insulating layers 123 adjacent to each other in the first direction I.

Because the first and second sacrificial layers 115 and 125 of the dummy pattern DUP in the resistive element region RAR are not exposed by the slit SI, the first and second sacrificial layers 115 and 125 are not removed and remain. That is, although the recess regions RA are formed in the cell array region CAR through the slit SI, the first and second sacrificial layers 115 and 125 of the dummy pattern DUP may remain in a state in which they overlap with the resistor pattern 119RS. For example, the second sacrificial layers 125 overlap the resistor pattern 119RS and the first sacrificial layer 115 is overlapped by the resistor pattern 119RS.

Referring to FIG. 12B, the operation ST19 may include filling the recess regions RA shown in FIG. 12A with conductive patterns 173. Forming the conductive patterns 173 may include forming a second blocking insulating layer 171 extending over surfaces of the recess regions RA and the slit SI, forming a gate conductive layer filling in the recess regions RA on the second blocking insulating layer 171, and dividing the gate conductive layer into a plurality of conductive patterns 173 by performing an etching process such that the gate conductive layer in the slit SI is removed.

The second blocking insulating layer 171 may be formed of an insulating layer having a high dielectric constant. More specifically, the second blocking insulating layer 171 may include an aluminum oxide layer. The aluminum oxide layer may be deposited in an amorphous state and then crystallized through a heat treatment process. While the heat treatment process for forming the second blocking insulating layer 171 is being performed, the first conductivity type dopant at a lower portion of the well doped semiconductor layer 101 may be diffused toward an upper portion of the well doped semiconductor layer 101 and be further diffused into the channel contact layer 161, the horizontal channel layer 109, and the channel pillar 137.

The gate conductive layer may include a low-resistance metal so as to form a low-resistance line. For example, the gate conductive layer may be formed of a tungsten layer.

Through the processes described for FIGS. 12A and 12B, a gate stack structure GST is formed in the first region including the cell array region CAR. The first and second sacrificial layers 115 and 125 remain as the dummy pattern DUP in the resistive element region RAR disposed in the same layer as the conductive patterns 171 of the gate stack structure GST.

Figure 13A:
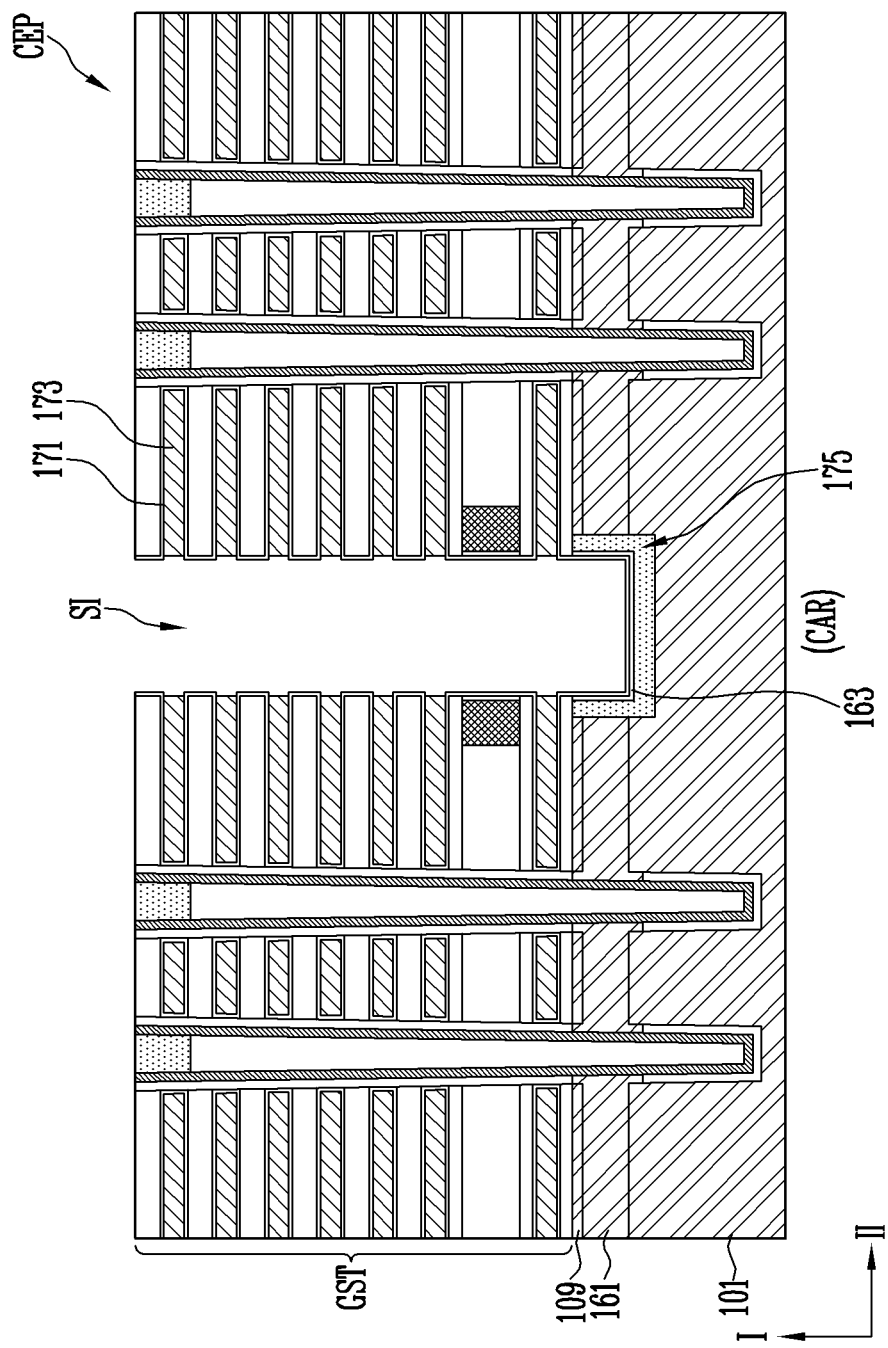
Figure 13B:
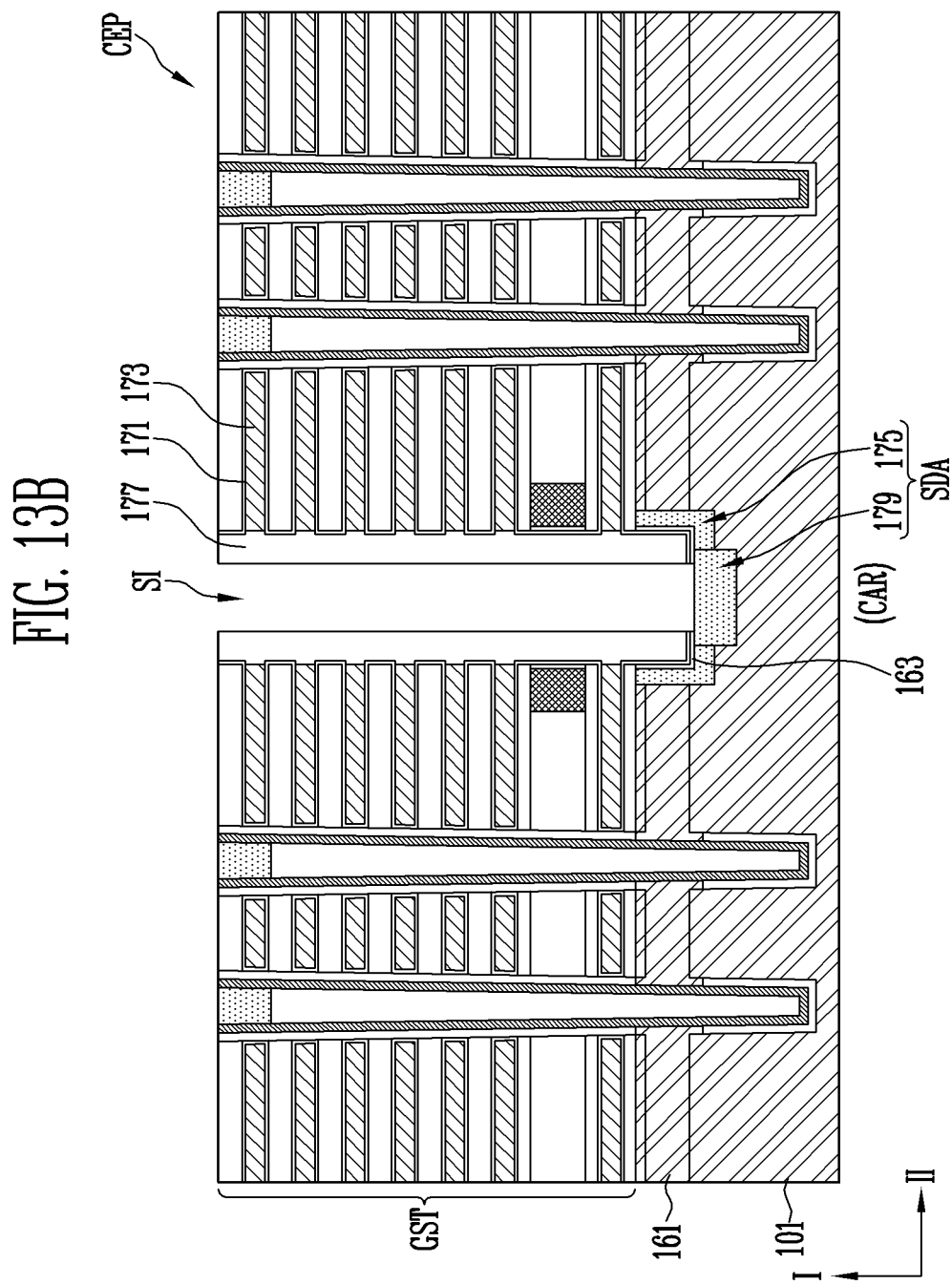

FIGS. 13A to 13C show sectional views illustrating the operations ST21 and ST23 indicated in FIG. 5.

Referring to FIG. 13A, the operation ST21 may include forming a first source region 175 by injecting a second conductivity type dopant through the slit SI. The first source region 175 may be formed by injecting the second conductivity type dopant toward the inside of each of the well doped semiconductor layer 101, the channel contact layer 161, and the horizontal channel layer 109, which are adjacent to the slit SI. The first source region 175 may include the second conductivity type dopant at a first concentration. When the first source region 175 is formed, a tilt ion injection process may be performed such that the second conductivity type dopant may be injected into each of the channel contact layer 161 and the horizontal channel layer 109, which are adjacent to the sidewall of the slit SI. The second oxidation region 163 may serve as a buffer while the second conductivity type dopant is being injected.

Referring to FIG. 13B, the operation ST21 may include forming a sidewall insulating layer 177 on the sidewall of the slit SI. The sidewall insulating layer 177 is removed from the bottom surface of the slit SI. While a portion of the sidewall insulating layer 177 is being removed from the bottom surface of the slit SI, a portion of each of the second blocking insulating layer 171 and the second oxidation region 163 is removed. Therefore, the well doped semiconductor layer 101 may be exposed.

The operation ST21 may include forming a second source region 179 by injecting the second conductivity type dopant into the well doped semiconductor layer 101 through the slit SI. The second source region 179 may include the second conductivity type dopant at a second concentration higher than the first concentration for the first source region 175. Accordingly, a source dopant region SDA including the first source region 175 and the second source region 179 is defined.

The second conductivity type dopant is opposite to the first conductivity type dopant in the well doped semiconductor layer 101. The well doped semiconductor layer 101 may include a p-type dopant, and the source dopant region SDA may include an n-type dopant.

Referring to FIG. 13C, for the operation ST23, the inside of the slit SI may be filled with a source contact line 181. The source contact line 181 is insulated from the gate stack structure GST by the sidewall insulating layer 177. The source contact line 181 is in ohmic contact with the second source region 179.

Figure 14A:
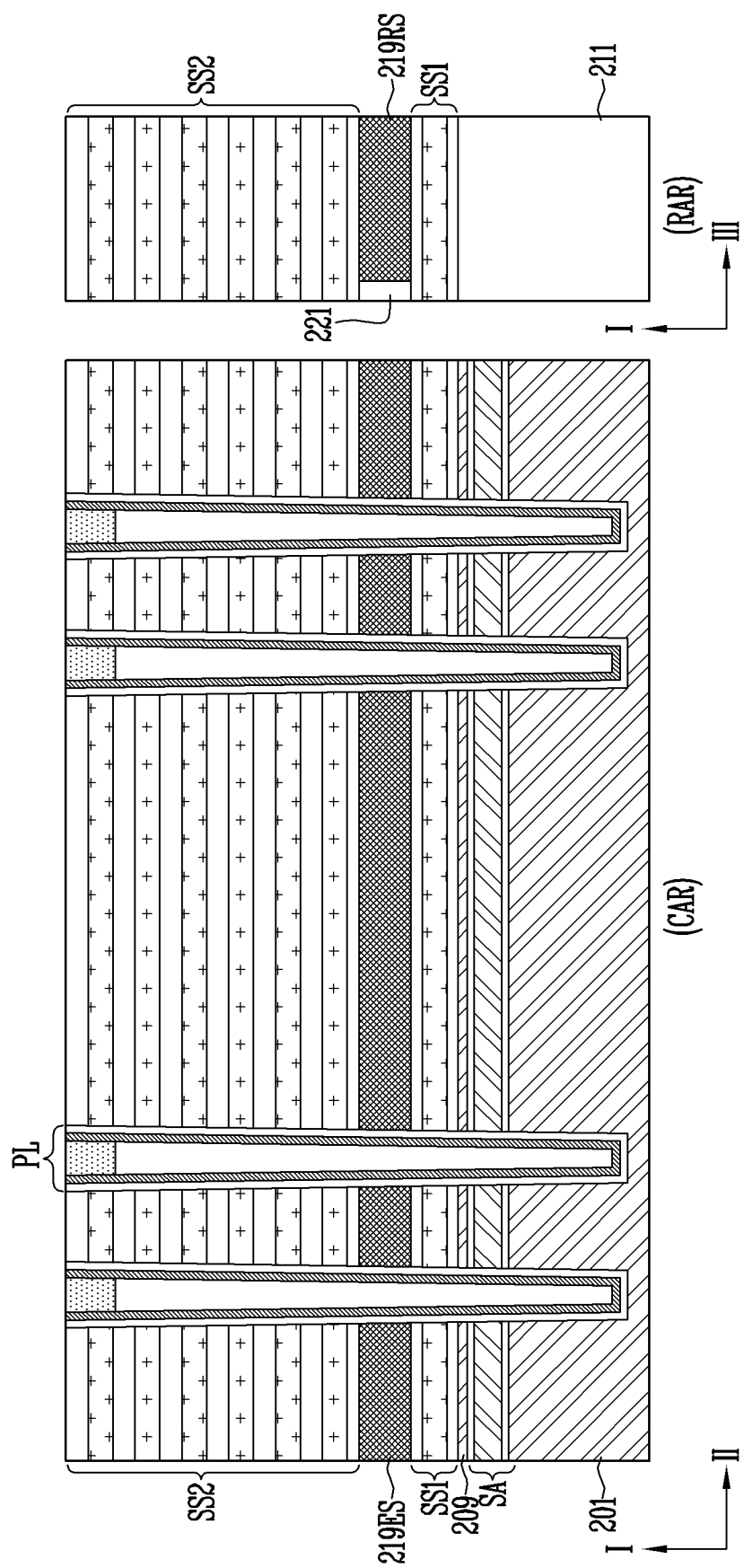
FIGS. 14A and 14B show sectional views illustrating a manufacturing method of a semiconductor device according to another embodiment of the present disclosure.
Figure 14B:
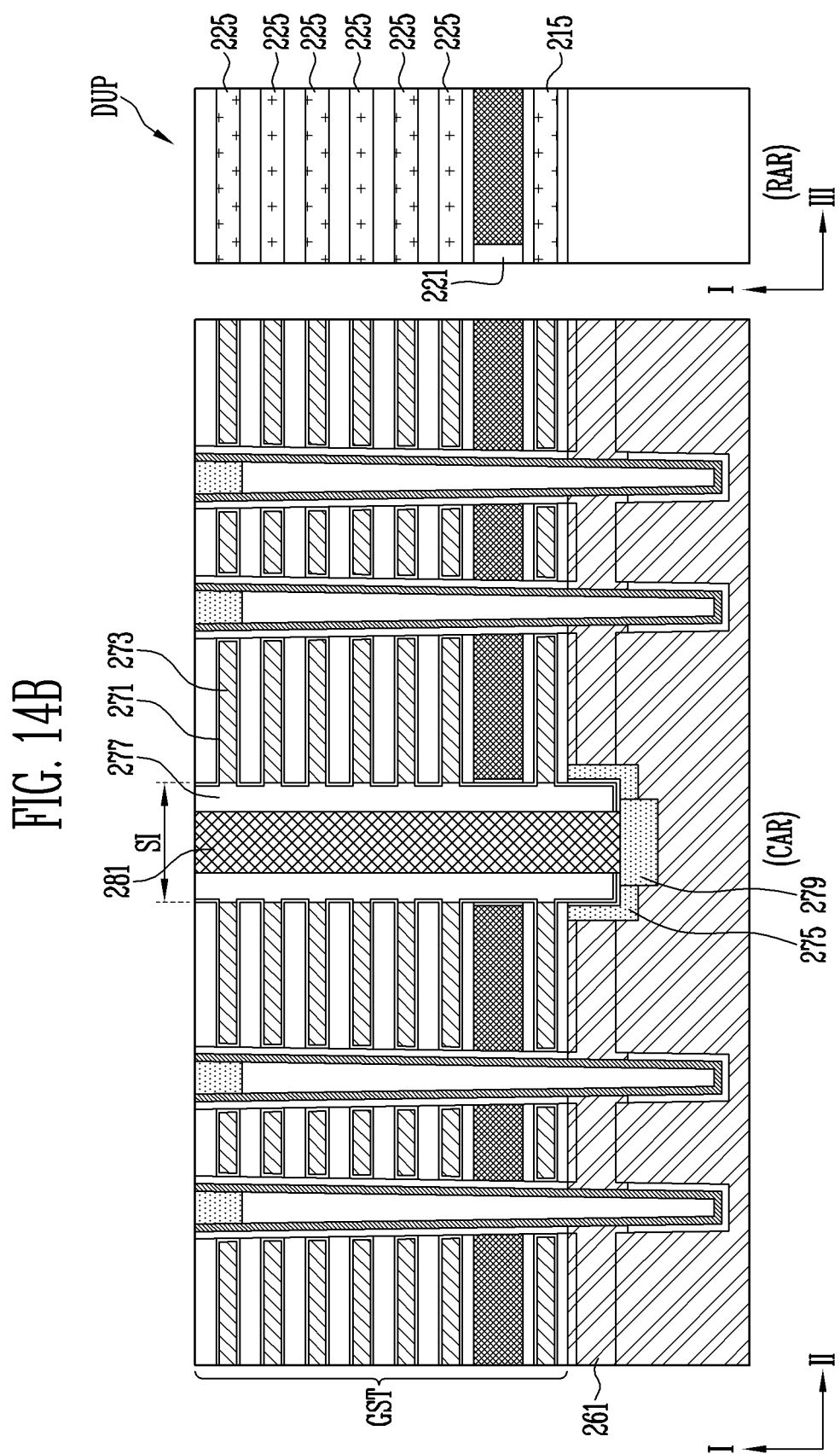

FIGS. 14A and 14B illustrate an embodiment of a manufacturing method for the semiconductor device shown in FIGS. 2B and 4B.

Referring to FIG. 14A, a well doped semiconductor layer 201, a sacrificial structure SA, a horizontal channel layer 209, and a lower insulating layer 211 may be formed using the same processes and materials as described for FIG. 6A.

Subsequently, a first stack structure SS1 is formed using the same processes and materials as described for FIG. 6A. After that, an etch stop pattern 219ES, a resistor pattern 219RS, and an isolation insulating layer 221 are formed on the first stack structure SS1 by performing the operations ST5 and ST7 indicated in FIG. 5. The etch stop pattern 219ES may entirely remain in the cell array region CAR, and the resistor pattern 219RS may remain in the resistive element region RAR. The resistor pattern 219RS may be electrically isolated from the etch stop pattern 219ES by the isolation insulating layer 221.

After that, a second stack structure SS2 is formed using the same processes and materials as described for FIG. 7.

Subsequently, after the operation ST11 described for FIG. 8 is performed, cell plugs PL may be formed. The cell plugs PL may be formed using the same processes and materials as described for FIG. 9. However, in embodiments of the present disclosure, the cell plugs PL further penetrate the etch stop pattern 219ES.

Referring to FIG. 14B, a slit SI is formed using the same processes as described for FIGS. 10A to 10D.

After that, a channel contact layer 261 is formed using the same processes as described for FIGS. 11A to 11D.

Subsequently, a gate stack structure GST including conductive patterns 273 is formed in the cell array region CAR, using the same processes described for FIGS. 12A and 12B. At this time, first and second sacrificial layers 215 and 225 in the resistive element region RAR remain as a dummy pattern DUP in the same layer as the conductive patterns 273. The conductive patterns 273 are formed on a second blocking insulating layer 271.

Subsequently, a first source region 275, a sidewall insulating layer 277, a second source region 279, and a source contact line 281 are formed using the same processes described for FIGS. 13A to 13C.

According to above-described embodiments of the present disclosure, the etch stop pattern is disposed between the stacked patterns while surrounding the channel pillars, simplifying a manufacturing processes for controlling the depth of the slit of the semiconductor device.

Figure 15:
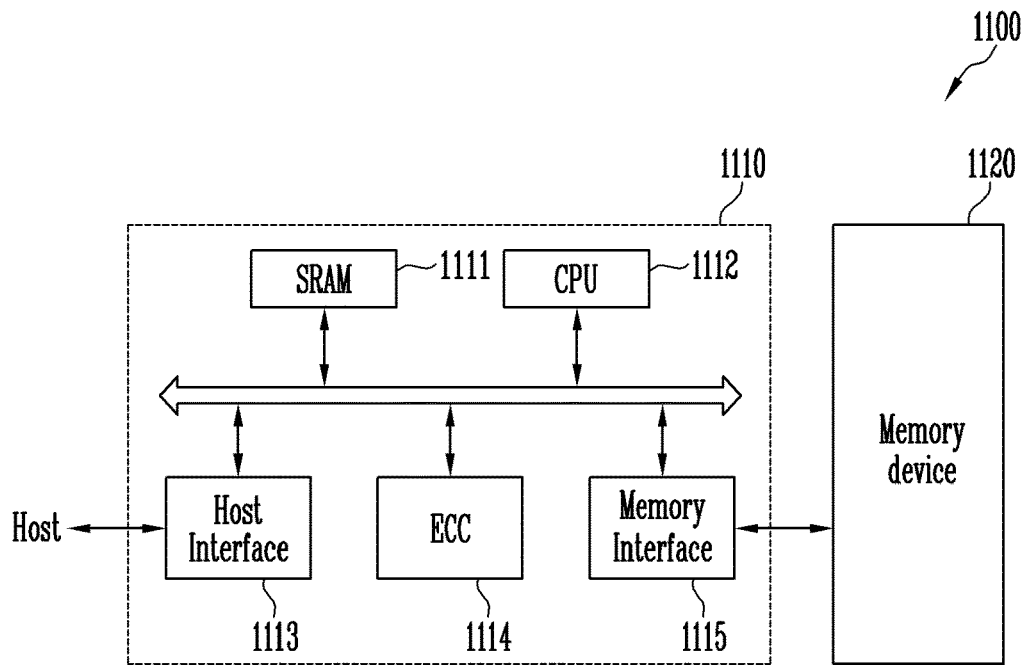
FIG. 15 shows a block diagram illustrating a configuration of a memory system according to an embodiment of the present disclosure.

FIG. 15 shows a block diagram illustrating a configuration of a memory system 1100 according to an embodiment of the present disclosure.

Referring to FIG. 15, the memory system 1100 includes a memory device 1120 and a memory controller 1110.

The memory device 1120 may include the structure described with reference to FIGS. 2A, 2B, 4A, and/or 4B. The memory device 1120 may be a multi-chip package configured with a plurality of flash memory chips.

The memory controller 1110 is configured to control the memory device 1120 and may include a static random access memory (SRAM) 1111, a central processing unit (CPU) 1112, a host interface 1113, an error correction code (ECC) circuit 1114, and a memory interface 1115. The SRAM 1111 is used as an operation memory of the CPU 1112, the CPU 1112 performs overall control operations for data exchange of the memory controller 1110, and the host interface 1113 utilizes a data exchange protocol for a host connected with the memory system 1100. The ECC circuit 1114 detects and corrects errors included in data read from the memory device 1120, and the memory interface 1115 interfaces with the memory device 1120. In addition, the memory controller 1110 may further include ROM for storing code data for interfacing with the host and the like.

The memory system 1100 configured as described above may be a memory card or a solid state disk (SSD) in which the memory device 1120 is combined with the controller 1110. For example, when the memory system 1100 is an SSD, the memory controller 1100 may communicate with external devices (e.g., the host) through one among various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, or an integrated drive electronics (IDE) protocol.

Figure 16:
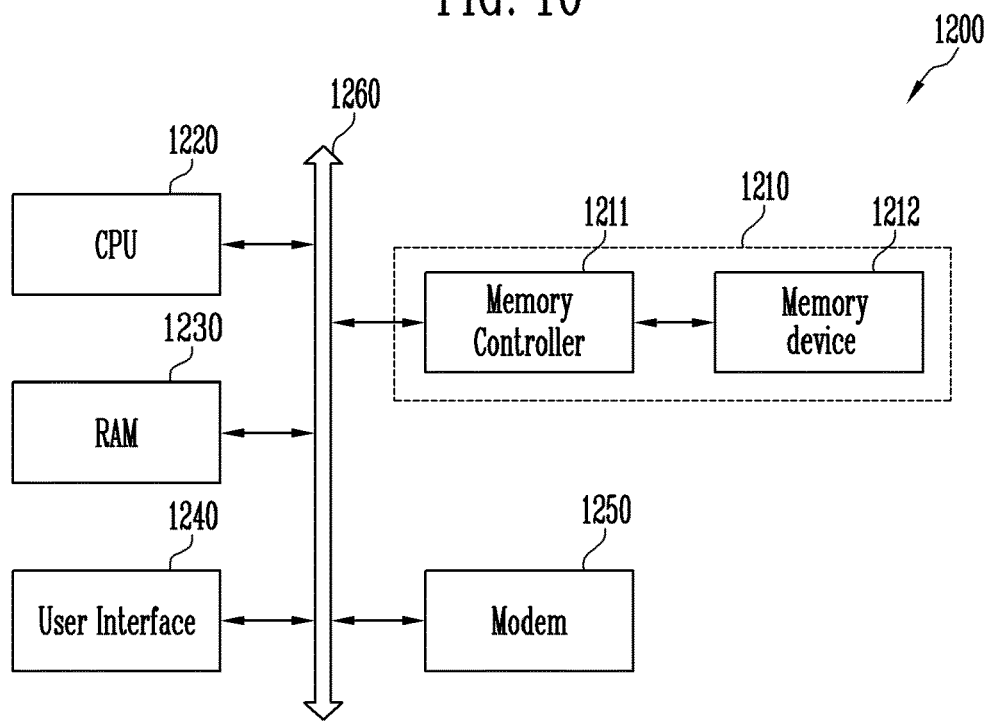
FIG. 16 shows a block diagram illustrating a configuration of a computing system according to an embodiment of the present disclosure.

FIG. 16 shows a block diagram illustrating a configuration of a computing system 1200 according to an embodiment of the present disclosure.

Referring to FIG. 16, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included Additionally, an application chip set, a camera image processor (CIS), a mobile D-RAM, and the like may be further included.

The memory system 1210 includes a memory device 1212 and a memory controller 1211. For some embodiments, the memory device 1212 and the memory controller 1211 correspond to the memory device 1120 and the memory controller 1110, respectively, of FIG. 15.

Examples of embodiments have been disclosed herein, and although specific terms are employed, the terms are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and detail may be made without departing from the spirit and scope of the present disclosure as set forth in the following claims.

What is claimed is:

1. A semiconductor device comprising:
a channel pillar extending in a first direction;
a first conductive pattern surrounding the channel pillar;
second conductive patterns surrounding the channel pillar above the first conductive pattern, wherein the second conductive patterns are stacked in the first direction and spaced apart from each other;
an etch stop pattern disposed at a higher level than the first conductive pattern and at a lower level than the second conductive patterns; and
a channel contact layer disposed at a lower level than the first conductive pattern and in contact with the channel pillar,
wherein the first conductive pattern, the second conductive patterns and the etch stop pattern are spaced apart from the channel pillar.

2. The semiconductor device of claim 1 further comprising a slit extending in the first direction, wherein the slit passes through each of the second conductive patterns, the first conductive pattern, and the etch stop pattern.

3. The semiconductor device of claim 1, wherein the etch stop pattern comprises a conductive material different than a material from which the first conductive pattern and the second conductive patterns are formed.

4. The semiconductor device of claim 1, wherein the etch stop pattern is formed from a poly-silicon layer.

5. The semiconductor device of claim 1 further comprising an isolation insulating layer disposed above the first conductive pattern and below the second conductive patterns, wherein the isolation insulating layer surrounds the channel pillar, wherein a width of the isolation insulating layer is narrower in a second direction perpendicular to the first direction than each width of the first conductive pattern and the second conductive patterns, and wherein the etch stop pattern is disposed on a sidewall of the isolation insulating layer.

6. The semiconductor device of claim 1, wherein the etch stop pattern extends parallel to the first conductive pattern and the second conductive patterns to surround the channel pillar.

7. The semiconductor device of claim 1, further comprising interlayer insulating layers disposed between the first conductive pattern and the etch stop pattern, disposed between the second conductive patterns, and disposed below the second conductive patterns and above the etch stop pattern, wherein the interlayer insulating layers surround the channel pillar, and wherein the etch stop pattern comprises a material different than a material from which the interlayer insulating layers are formed.

8. The semiconductor device of claim 1 further comprising:
  a well doped semiconductor layer disposed under the first conductive pattern, wherein the well doped semiconductor layer is spaced apart from the first conductive pattern;
  a first multi-layered memory pattern extending along a sidewall of the channel pillar, wherein the first multi-layered memory pattern is disposed between the channel pillar and gate electrodes;
  a second multi-layered memory pattern extending along the sidewall of the channel pillar, wherein the second multi-layered memory pattern is disposed between the well doped semiconductor layer and the channel pillar;
  a horizontal channel layer disposed on the channel contact layer, wherein the horizontal channel layer surrounds the channel pillar; and
  a gate insulating layer disposed between the horizontal channel layer and the first conductive pattern, wherein the gate insulating layer surrounds the channel pillar.

9. The semiconductor device of claim 8, further comprising a source dopant region partially disposed in the channel contact layer and partially disposed in the well doped semiconductor layer, wherein the source dopant region is doped with an n-type dopant.

10. The semiconductor device of claim 9 further comprising:
  interlayer insulating layers respectively disposed between the first conductive pattern and the etch stop pattern, disposed between the second conductive patterns, and disposed under the second conductive patterns and above the etch stop pattern, wherein the interlayer insulating layers surround the channel pillar;
  a source contact line in contact with the source dopant region, wherein the source contact line extends from the source dopant region in the first direction;
  a sidewall insulating layer disposed between the source contact line and a sidewall of a stack structure facing the source contact line, wherein the stack structure includes the channel contact layer, the horizontal channel layer, the gate insulating layer, the first conductive pattern, the etch stop pattern, the interlayer insulating layers, and the second conductive patterns; and
  a blocking insulating layer extending along interfaces between the sidewall insulating layer and the interlayer insulating layers, interfaces between the interlayer insulating layers and the second conductive patterns, interfaces between the first multi-layered memory pattern and the second conductive patterns, an interface between the sidewall insulating layer and the etch stop pattern, an interface between the first conductive pattern and the interlayer insulating layer, an interface between the first conductive pattern and the first multi-layered memory pattern, an interface between the first conductive pattern and the gate insulating layer, and an interface between the gate insulating layer and the sidewall insulating layer.

11. The semiconductor device of claim 1 further comprising:
  a resistor pattern comprising a same material and formed in a same layer as the etch stop pattern; and
  nitride layers overlapping with the resistor pattern, wherein the nitride layers are disposed in the same level as the first conductive pattern and the second conductive patterns.

12. A semiconductor device comprising:
  a first channel pillar and a second channel pillar extending in a first direction from inside a well doped semiconductor layer;
  a first gate stack structure disposed above the well doped semiconductor layer, wherein the first gate stack structure surrounds the first channel pillar;
  a second gate stack structure disposed above the well doped semiconductor layer, wherein the second gate stack structure surrounds the second channel pillar;
  a first channel contact layer disposed between the well doped semiconductor layer and the first gate stack structure, wherein the first channel contact layer surrounds the first channel pillar;
  a second channel contact layer disposed between the well doped semiconductor layer and the second gate stack structure, wherein the second channel contact layer surrounds the second channel pillar;
  a slit disposed between the first gate stack structure and the second gate stack structure; and
  a sidewall insulating layer formed on a sidewall of the slit, wherein each of the first and second gate stack structures includes interlayer insulating layers and gate electrodes, which are alternately stacked along the first direction, and wherein an etch stop pattern is disposed between two gate electrodes of the gate electrodes adjacent to the well doped semiconductor layer.

13. The semiconductor device of claim 12, wherein the gate electrodes comprise a source select line nearest to the well doped semiconductor layer and multiple word lines above the source select line, and wherein the etch stop pattern is disposed above the source select line and below the word lines.

14. The semiconductor device of claim 12, wherein the etch stop pattern comprises a material different than the material from which the interlayer insulating layers and the gate electrodes are formed.

15. The semiconductor device of claim 12 further comprising an isolation insulating layer disposed in the same layer as the etch stop pattern, wherein the isolation insulating layer surrounds the first channel pillar or the second channel pillar, and wherein the etch stop pattern is disposed between the isolation insulating layer and the sidewall insulating layer.

16. The semiconductor device of claim 15, wherein each of the interlayer insulating layers protrudes farther toward the sidewall insulating layer than the isolation insulating layer.

17. The semiconductor device of claim 12, wherein the etch stop pattern extends parallel to the interlayer insulating layers and the gate electrodes, and wherein the etch stop pattern surrounds the first channel pillar or the second channel pillar.

18. The semiconductor device of claim 12 further comprising:

a source dopant region defined in the well doped semiconductor layer between the first gate stack structure and the second gate stack structure; and a source contact line in contact with the source dopant region, wherein the source contact line extends along the sidewall insulating layer.

19. The semiconductor device of claim 12 further comprising:

dummy insulating layers and nitride layers, disposed in the same layer as the interlayer insulating layers and the gate electrodes, wherein the dummy insulating layers and the nitride layers are alternately stacked; and a resistor pattern within the stacked nitride layers, wherein the resistor pattern is disposed in the same layer as the etch stop pattern, and wherein the etch stop pattern and the resistor pattern comprise a poly-silicon layer.

* * * * *